United States Patent
Yokosawa et al.

(10) Patent No.: US 6,665,552 B2
(45) Date of Patent: Dec. 16, 2003

(54) GRADIOMETER INTEGRATING PICKUP COILS AND MAGNETIC FIELD MEASUREMENT SYSTEM

(75) Inventors: Koichi Yokosawa, Kodaira (JP); Daisuke Suzuki, Kodaira (JP); Keiji Tsukada, Kashiwa (JP); Tsuyoshi Miyashita, Fuchu (JP); Akihiko Kandori, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 60 days.

(21) Appl. No.: 09/940,507

(22) Filed: Aug. 29, 2001

(65) Prior Publication Data

US 2002/0115571 A1 Aug. 22, 2002

(30) Foreign Application Priority Data

Feb. 21, 2001 (JP) .................................... 2001-044426

(51) Int. Cl.$^7$ ................................................ A61B 5/05
(52) U.S. Cl. ..................... 600/409; 324/248; 324/249
(58) Field of Search ............................... 600/409, 422; 324/248, 249

(56) References Cited

U.S. PATENT DOCUMENTS

| | | | | |
|---|---|---|---|---|
| 4,771,239 A | * | 9/1988 | Hoenig ........................ | 324/248 |
| 4,801,882 A | * | 1/1989 | Daalmans .................... | 324/248 |
| 5,319,307 A | * | 6/1994 | Simmonds ................... | 324/248 |
| 5,437,276 A | * | 8/1995 | Takada ........................ | 600/409 |
| 5,442,289 A | * | 8/1995 | DiIorio et al. .............. | 324/248 |
| 5,656,937 A | * | 8/1997 | Cantor ........................ | 324/248 |
| 5,955,400 A | * | 9/1999 | Yokosawa et al. .......... | 505/162 |
| 5,986,280 A | * | 11/1999 | Kugai .......................... | 257/34 |
| 6,154,026 A | * | 11/2000 | Dantsker et al. ............ | 324/248 |
| 6,300,760 B1 | * | 10/2001 | Schubert et al. ............ | 324/248 |

OTHER PUBLICATIONS

John Clarke, "Principles and Applications of SQUIDS", Proceedings of the IEEE, vol. 77, No. 8, Aug. 1989, pp. 1208–1223.

M. B. Ketchen, "Design of Improved Integrated Thin–film Planar dc SQUID Gradiometers", J. Appl. Phys. 58(11), Dec. 1, 1985, pp. 4322–4325.

Rashdi Shah Ahmad, Masateru Kubo, Yoshihiro Hirata, Shinya Kuriki and Satoshi Nakayama, "Large Inductance Superconducting Quantum Interference Device Magnetometer for Magnetoencephalography Measurement", Jpn. J. Appl. Phys. vol. 36 (1997), Part 1, No. 11, Nov. 1997, pp. 6737–6741.

Keiji Tsukada, Yasuhiro Haruta, Akira Adachi, Hisanao Ogata, Katanori Komuro, Tsuyoshi Ito, Youichi Takada and Akihiko Kandori, "Multichannel SQUID System Detecting Tangential Components of the Cardiac Magnetic Field", Rev. Sci, Instrum. 66 (10), Oct. 1995, pp. 5085–5091.

M. Koyanagi, N. Kasai, K. Chinone, M. Nakanishi, S. Kosaka, M/ Higuchi and H. Kado, "An Integrated DC SQUID Gradiometer for Biomagnetic Application", IEEE Transactions on Magnetics, vol. 25, No. 2, Mar. 1989, pp. 1166–1169.

"Magnetic Source Imager WH", 4–D Neuro Imaging, pp. 1–8.

"Neuromag–122 A Window to the Human Brain", Neuromag, 1–7.

U.S. patent application based on Japanese Patent App 2000–334921 filed Oct. 30, 2000.

U.S. patent application based on Japanese Patent App 2001–044424 (being filed Aug. 29, 2001,.

\* cited by examiner

*Primary Examiner*—George Manuel
*Assistant Examiner*—Devaang Shah

(57) ABSTRACT

A gradiometer integrating pickup coils comprises pickup coils 11Xp, 11Xn magnetically connected to a SQUID through associated input coils 2, and pickup coils 11Yp, 11Yn magnetically connected to a SQUID through associated input coils 2, respectively. Two superconducting loops are connected in series to each of the SQUIDs, when viewed from Josephson junctions 5. The input coils 2 form superconducting closed loops together with the pickup coils 11Xp, 11Xn, 11Yp, 11Yn associated therewith. The SQUIDs are respectively connected to form an 8-figured shape as a whole such that currents flow in two superconducting loops of each SQUID in opposite directions to each other, with respect to the application of a uniform field, in order to reduce environmental magnetic field noise.

16 Claims, 22 Drawing Sheets

CENTER OF GRADIOMETER

GRADIOMETER INTEGRATING PICKUP COILS AND MAGNETIC FIELD MEASUREMENT SYSTEM

CROSS-REFERENCE TO RELATED APPLICATIONS

The present application is relevant to U.S. patent application Ser. No. 09/940,542 being filed by Daisuke Suzuki, Tsuyoshi Miyashita, Akihiko Kandori, Keiji Tsukada and Kouich Yokosawa, and assigned to the present assignee, based on Japanese Patent Application No. 2001-044424 filed on Feb. 21, 2001, and U.S. patent application Ser. No. 09/941,752 being filed by Daisuke Suzuki, Atsushi Ninomiya, Tsuyoshi Miyashita, Akihiko Kandori, Keiji Tsukada and Kouich Yokosawa, and assigned to the present assignee, based on Japanese Patent Application No. 2000-334921 filed on Oct. 30, 2000. The contents of these applications are incorporated herein by reference.

BACKGROUND OF THE INVENTION

The present invention relates to a SQUID (Superconducting Quantum Interference Device) integrating pickup coils which can highly sensitively detect a magnetic field generated from a subject under testing, and more particularly, to a magnetic field measurement system using the SQUID integrating pickup coils. More specifically, the present invention relates to a biomagnetometer which uses a multichannel SQUID integrating pickup coils for measuring a biomagentic field generated by neural activities of a human brain, myocardium activities of a human heart, and so on, and a magnetic field measurement system which uses a multichannel SQUID integrating pickup coils for conducting a non-destructive evaluation.

Generally, a SQUID gradiometer for measuring a biomagnetic field is comprised of axial pickup coils formed of superconducting wires, and a SQUID formed of a thin film which is superconductively connected to the pickup coils. To reduce environmental magnetic field noise, a gradiometer is often used as a pickup coil for detecting a field gradient in a direction of a detected magnetic field. When the detected magnetic field is oriented in the normal direction (z-direction), the gradiometer detects a z-gradient of a z-component ($\Delta Bz/\Delta z$) of the detected magnetic field (Prior Art 1: J. Clarke, Proceedings of the IEEE, Vol. 77, No. 8, pp. 1208–1223 (1989)).

Since a pickup coil formed of a super-conducting wire is limited in a reduction ratio of the environmental magnetic field noise, there has been proposed a method of forming a pickup coil of a thin film for detecting a field gradient in one direction perpendicular to a detected magnetic field. In this event, a gradiometer detects ($\Delta Bz/\Delta x$) or ($\Delta Bz/\Delta y$), where Bz is a detected magnetic field (Prior Art 2: M. B. Ketchen, J. Appl. Phys., Vol. 58, No. 11, pp. 4322–4325 (1985)).

Also, for preventing the SQUID itself from picking up the environmental magnetic field noise, a known gradiometer comprises a differential SQUID configuration by arranging holes of the SQUID in series or in parallel (Prior Art 2 and Prior Art 3: R. S. Ahmad et al. Jpn. J. Appl. Phys., Vol. 36, Part 1, No. 11, pp. 6737–6741 (1997)).

Another known gradiometer has one of pickup coils constituting the gradiometer connected to the foregoing differential SQUID (Prior Art 4: K. Tsukada et al, Rev. Sci. Instrum., Vol. 66, No. 10, pp. 5085–5091 (1995)).

A further known gradiometer has one of pickup coils constituting the gradiometer and the differential SQUID fabricated on the same substrate (Prior Art 5: M. Koyanagi et al, IEEE Transactions on Magnetics, Vol. 25, No. 2, pp. 1166–1169 (1989)).

The foregoing exemplary gradiometers are configured to detect a field gradient ($\Delta Bz/\Delta x$) or ($\Delta Bz/\Delta y$) in one direction of the field. For estimating a source (current source) in a biomagnetometer, it is necessary to measure both ($\Delta Bz/\Delta x$) and ($\Delta Bz/\Delta y$) at the same time. To meet this requirement, there has been reported an element which has two gradiometers,fabricated on a single substrate, which detect field gradients rectangular to each other (Prior Art 6: 4D Neuroimaging, Product Document).

A gradiometer integrating pickup coils according to the present invention is fabricated of thin films on a substrate. In the following description, a rectangular coordinate system (x, y, z) is used, where a plane parallel with the surface of the substrate is defined as an xy-plane; and a direction perpendicular to the substrate as a z-axis. The gradiometer integrating pickup coils according to one embodiment of the present invention is configured to detect a gradient ($\Delta Bz/\Delta x$) of a magnetic field component (Bz) in the normal direction (z-direction) with respect to the x-direction and/or a gradient ($\Delta Bz/\Delta y$) with respect to the y-direction. First, terms used in the following description will be explained below.

"A pickup coil" refers to a planar pickup coil fabricated of a thin film on a substrate.

"A center of a pickup coil" refers to the center of the outer shape of the pickup coil. Here, the center of the pickup coil is defined as the center of gravity of an ideal plate having an outer shape equal to the outer shape of the pickup coil.

"An axial segment of a pickup coil" refers to a segment connecting the centers of two pickup coils, which form part of a gradiometer, projected perpendicularly onto the surface of the substrate.

"An axial segment of a pickup coil in an x-direction" refers to a segment connecting the centers of two pickup coils positioned in the x-direction in a gradiometer for the x-gradient, projected perpendicularly onto the surface of the substrate. The length of this axial segment is a baseline length of the gradiometer in the x-direction.

"An axial segment of a pickup coil in a y-direction" refers to a segment connecting the centers of two pickup coils positioned in the y-direction in a gradiometer for y-gradient, projected perpendicularly onto the surface of the substrate. The length of this axial segment is a baseline length of the gradiometer in the y-direction.

"The center of a pickup coil" refers to the midpoint on an axial segment of a pickup coil.

"The center of a pickup coil in the x-direction" refers to the midpoint on the axial segment of a pickup coil in the x-direction.

"The center of a pickup coil in the y-direction" refers to the midpoint on the axial segment of a pickup coil in the y-direction.

"A differential SQUID" is a planar SQUID fabricated of a thin film on a substrate, the holes of which are in series or parallel differential configuration.

"An axial segment of a differential SQUID" refers to a segment connecting the center of a first superconducting loop (SQUID hole), forming part of a differential SQUID, with the center of a second superconducting loop (SQUID hole), likewise forming part of the differential SQUID, projected perpendicularly onto the surface of the substrate.

"The center of a differential SQUID" refers to the midpoint on the axial segment of the differential SQUID.

"An axial segment of a differential SQUID in the x-direction" refers to the axial segment of the differential SQUID oriented in the x-direction, projected perpendicularly onto the surface of the substrate.

"An axial segment of a differential SQUID in the y-direction" refers to the axial segment of the differential SQUID oriented in the y-direction, projected perpendicularly onto the surface of the substrate.

"The center of a differential SQUID in the x-direction" refers to the midpoint on the axial segment of the differential SQUID in the x-direction.

"The center of a differential SQUID in the y-direction" refers to the midpoint on the axial segment of the differential SQUID in the y-direction.

"An axial segment of a pickup coil is in alignment with an axial segment of a differential SQUID" means that the axial segment of a pickup coil overlaps the axial segment of the differential SQUID.

"An axial segment of a pickup coil in the x-direction is in alignment with an axial segment of a differential SQUID in the x-direction" means that the axial segment of a pickup coil in the x-direction overlaps the axial segment of the differential SQUID in the x-direction.

"An axial segment of a pickup coil in the y-direction is in alignment with an axial segment of a differential SQUID in the y-direction" means that the axial segment of a pickup coil in the y-direction overlaps the axial segment of the differential SQUID in the y-direction.

"The center of a gradiometer integrating pickup coils" (1) refers to a point at which the center of the pickup coil in the x-direction matches the center of the differential SQUID in the x-direction; (2) refers to a point at which the center of the pickup coil in the y-direction matches the center of the differential SQUID in the y-direction; and (3) refers to a point at which the center of the pickup coil in the x-direction, the center of the differential SQUID in the x-direction, the center of the pickup coil in the y-direction, and the center of the differential SQUID in the y-direction match one another.

The aforementioned Prior Art 1 has a problem of complicated installation, and inevitable errors included in a measured magnetic field due to environmental magnetic field noise introduced from wires used for the installation. In addition, a pickup coil formed of a wire has a problem of a limited mechanical accuracy and a limited reduction ratio of the environmental magnetic field noise.

Prior Arts 2, 3, 4 also have a problem left unsolved that environmental magnetic field noise is introduced from wires for installation, since the magnetic coils are not integrated with the SQUID, to inevitably cause errors in a measured magnetic field.

FIG. 1 is a diagram for generally explaining the configuration of a single-direction (x-direction) gradiometer according to the prior art which has two pickup coils and a differential SQUID fabricated on a single substrate. In Prior Art 5, an axial segment 22X of a pickup coil is not in alignment with an axial segment 21 of the differential SQUID (1X), and the centers of the pickup coils do not match the center of the differential SQUID, as shown in FIG. 1, so that Prior Art 5 experiences errors inevitably introduced into in a measured magnetic field. In addition, Prior Art 5 does not take into account a simultaneous measurement of x-gradient and y-gradient.

FIG. 2 is a diagram for generally explaining the configuration of two rectangular pickup coils in x-and y-direction of a gradiometer according to the prior art. Prior Art 6 forms two rectangular pickup coils 11Xp, 11Xn in the x-direction, and pickup coil 11Yp, 11Yn in the y-direction of the gradiometer, with the centers of the pickup coils in the x-direction matching the centers of the pickup coils in the y-direction. However, as shown in FIG. 2, Prior Art 6 fails to explicitly indicate the position at which differential SQUIDs in the x-direction and y-direction are formed corresponding to the pickup coils in the x-direction and y-direction. Also, Prior Art 6 has a problem that when a substrate on which the pickup coils are fabricated is separated from a substrate on which the SQUIDs are fabricated, so that environmental field magnetic noise is introduced from wires for installation, causing inevitable errors in a measured magnetic field. It should be noted that in FIG. 2, the pickup coils in the x-direction and y-direction are drawn in different line widths, and the centers of the pickup coils in the x-direction and y-direction are offset from each other for the ease of understanding.

The following three conditions must be satisfied for accurately detecting a magnetic field at a high sensitivity using pickup coils and differential SQUIDs fabricated of respective thin films on a substrate. However, any configuration satisfying the three conditions has not been known before.

(1) An axial segment of a pickup coil forming part of a gradiometer is in alignment with an axial segment of a differential SQUID.

(2) The center of a pickup coil forming part of an x-direction gradiometer, the center of a differential SQUID in the x-direction, the center of a pickup coil forming part of a y-direction gradiometer, and the center of a differential SQUID in the y-direction match one another.

(3) The pickup coils and differential SQUIDs are fabricated together on the same substrate to eliminate superconducting connections.

SUMMARY OF THE INVENTION

It is an object of the present invention to provide a gradiometer integrating pickup coils formed of thin films, which is capable of satisfying the foregoing three conditions, reducing the introduced environmental magnetic field noise, and detecting a magnetic field generated from a subject under testing at a high sensitivity. More particularly, it is an object of the present invention to provide a biomagnetometer which uses a multichannel gradiometer integrating pickup coils as a detector for purposes of measuring a biomagnetic field generated from neural activities of a human brain and myocardium activities of a human heart, and so on, and a magnetic field measurement system which uses the gradiometer integrating pickup coils as a detector for purposes of conducting a non-destructive evaluation.

The gradiometer integrating pickup coils according to the present invention may be implemented in two configurations: a flux transformer configuration, and a parallel pickup coil configuration. The flux transformer configuration transmits a magnetic field detected by a pickup coil to a SQUID through an input coil, where the pickup coil is not electrically connected to the SQUID. The parallel pickup coil configuration has parallelly connected superconducting loops which form a SQUID, where pickup loops are not strictly distinguished from the superconducting loops of the SQUID.

In a gradiometer integrating pickup coils in flux transformer configuration, an axial segment of a pickup coil is placed in alignment with an axial segment of a differential SQUID, with the center of the pickup coil (midpoint on the axial segment of the pickup coil) matching the center of the differential SQUID (midpoint on the axial segment of the SQUID). In this configuration, the pickup coil and differential SQUID are fabricated on the same substrate for eliminating superconducting connections.

For simultaneously measuring an x-gradient and a y-gradient, an x-direction gradiometer and a y-direction gradiometer are fabricated on the same substrate, with an axial segment of a pickup coil in the x-direction placed in alignment with an axial segment of a differential SQUID in the x-direction, an axial segment of a pickup coil in the y-direction placed in alignment with an axial segment of a differential SQUID in the y-direction, and the axial segment of the pickup coil in the x-direction and the axial segment of the pickup coil in the y-direction crossing at right angles. In addition, the center of the pickup coil in the x-direction, the center of the differential SQUID in the x-direction, the center of the pickup coil in the y-direction, and the center of the differential SQUID in the y-direction match one another. For eliminating superconducting connections, the pickup coil in the x-direction, pickup coil in the y-direction, differential SQUID in the x-direction and differential SQUID in the y-direction are all fabricated of thin films on the same substrate.

In a gradiometer integrating pickup coils in parallel pickup coil configuration, parallelly connected pickup coils form superconducting loops of a differential SQUID. Also, parallelly coupled pickup coils constituting a differential SQUID in the x-direction and parallelly coupled pickup coils constituting a differential SQUID in the y-direction are fabricated on a single substrate, such that an axial segment of the pickup coils in the x-direction and an axial segment of the pickup coils in the y-direction cross at right angles. Further, the center of the pickup coils in the x-direction matches the center of the pickup coils in the y-direction.

The gradiometer integrating pickup coils of the present invention can accurately measure a gradient ($\Delta Bz/\Delta x$) with respect to the x-direction or a gradient ($\Delta Bz/\Delta y$) with respect to the y-direction of a field component (Bz) in the normal direction in a simple design, irrespective of the configuration, with introduction of less environment magnetic field noise and less errors. In addition, the gradiometer integrating pickup coils of the present invention can simultaneously detect the gradient ($\Delta Bz/\Delta x$) with respect to the x-direction and the gradient ($\Delta Bz/\Delta y$) with respect to the y-direction.

The gradiometer of the present invention is particularly suitable for accurately detecting a feeble biomagnetic field.

The following description will be made on a first feature of the gradiometer integrating pickup coils in flux transformer configuration. A first and a second pickup coil substantially in the shape of square, and a differential SQUID are fabricated of thin films on the same substrate. The differential SQUID is magnetically coupled to the first and second pickup coils, and is formed of a first and a second superconducting loop connected in series or in parallel.

The first and second pickup coils and the first and second superconducting loops are fabricated of thin films on the same substrate so as to satisfy the following conditions (1), (2):

(1) A first segment resulting from projecting a segment connecting the center of the first pickup coil with the center of the second pickup coil perpendicularly onto the surface of the substrate overlaps a second segment resulting from projecting a segment connecting the center of the first superconducting loop with the center of the second superconducting loop perpendicularly onto the surface of the substrate.

(2) The midpoint of the first segment matches the midpoint of the second segment.

The first and second pickup coils constitute closed loops together with a first and a second input coil, respectively. The first pickup coil has the first input coil in a first loop for inputting magnetic flux generated by a first current induced in the first pickup coil by a magnetic field in a z-direction perpendicular to the surface of the substrate into the first superconducting loop. On the other hand, the second pickup coil has the second input coil in a second loop for inputting magnetic flux generated by a second current induced in the second pickup coil by the magnetic field in the z-direction into the second superconducting loop.

The gradiometer integrating pickup coils in the first feature is capable of detecting a field gradient in the z-direction with respect to the x-direction or y-direction, which is in parallel with the surface of the substrate and perpendicular to the z-direction. Since the pickup coils as well as the SQUID are fabricated of thin films, the gradiometer exhibits a high mechanical accuracy, and does not generate any error since the center of the pickup coils matches the center of superconducting loops of the SQUID.

The following description will be made on a second feature of the gradiometer integrating pickup coils in flux transformer configuration. A first, a second, a third, and a fourth pickup coil substantially in the shape of square, and a first and a second differential SQUID are fabricated of thin films on the same substrate. The first differential SQUID is formed of a first and a second superconducting loop connected in series or in parallel, and is magnetically coupled to the first and second pickup coils. The second differential SQUID is formed of a third and a fourth superconducting loop connected in series or in parallel, and is magnetically coupled to the third and fourth pickup coils.

The first, second, third and fourth pickup coils and the first, second, third and fourth superconducting loops are fabricated of thin films on the same substrate so as to satisfy the following conditions (1), (2), (3):

(1) A first segment resulting from projecting a segment connecting the center of the first pickup coil with the center of the second pickup coil perpendicularly onto the surface of the substrate overlaps a second segment resulting from projecting a segment connecting the center of the first superconducting loop with the center of the second superconducting loop perpendicularly onto the surface of the substrate.

(2) A third segment resulting from projecting a segment connecting the center of the third pickup coil with the center of the fourth pickup coil perpendicularly onto the surface of the substrate overlaps a fourth segment resulting from projecting a segment connecting the center of the third superconducting loop with the center of the fourth superconducting loop perpendicularly onto the surface of the substrate.

(3) The first segment and the third segment cross at right angles, and the midpoint of the first segment, the midpoint of the second segment, the midpoint of the third segment, and the midpoint of the fourth segment match one another.

The first, second, third and fourth pickup coils each form a closed loop together with a first, a second, a third and a fourth input coil associated therewith. The first pickup coil has the first input coil in a first loop for inputting magnetic flux generated by a first current induced in the first pickup coil by a magnetic field in a z-direction perpendicular to the surface of the substrate into the first superconducting loop. On the other hand, the second pickup coil has the second input coil in a second loop for inputting magnetic flux generated by a second current induced in the second pickup coil by the magnetic field in the z-direction into the second superconducting loop. The third pickup coil has the third input coil in a third loop for inputting magnetic flux generated by a third current induced in the third pickup coil by the magnetic field in the z-direction in the third superconducting loop. The fourth pickup coil has the fourth input coil in a fourth loop for inputting magnetic flux generated by a fourth current induced in the fourth pickup coil by the magnetic field in the z-direction in the fourth superconducting loop.

The gradiometer integrating pickup coils in the second feature is capable of simultaneously detecting field gradients in the z-direction with respect to the x-direction and the y-direction parallel with the surface of the substrate and perpendicular to the z-direction, in addition to the effects produced by the first feature.

The following description will be made on a third feature of the gradiometer integrating pickup coils in flux transformer configuration. A pickup coil formed of a first and a second pickup loop substantially in the shape of square, and a differential SQUID are fabricated of thin films on the same substrate. The pickup coil, fabricated of a thin film on the substrate, forms a closed loop together with an input coil in an 8-figured shape as a whole such that currents flow in the first and second pickup loops in directions opposite to each other, with respect to the application of a uniform field. The differential SQUID is magnetically coupled to the first and second pickup loops through the input coil, and is formed of a first and a second superconducting-loop connected in series or in parallel.

The pickup coil and the differential SQUID are fabricated of thin films on the same substrate so as to satisfy the following conditions (1), (2):

(1) A first segment resulting from projecting a segment connecting the center of the first pickup loop with the center of the second pickup loop perpendicularly onto the surface of the substrate overlaps a second segment resulting from projecting a segment connecting the center of the first superconducting loop with the center of the second superconducting loop perpendicularly onto the surface of the substrate.

(2) The midpoint of the first segment matches the midpoint of the second segment.

The gradiometer integrating pickup coils in the third feature is capable of detecting a field gradient in the z-direction with respect to the x-direction or the y-direction which is in parallel with the surface of the substrate and perpendicular to the z-direction. Since the pickup coil as well as the SQUID are fabricated of thin films, the gradiometer exhibits a high mechanical accuracy, and does not generate any error since the center of the pickup coil matches the center of superconducting loops of the SQUID.

The following description will be made on a fourth feature of the gradiometer integrating pickup coils in flux transformer configuration. A first and a second pickup coil and a first and a second differential SQUID are fabricated of thin films on the same substrate. The first pickup coil is fabricated of a thin film on the substrate such that a first and a second pickup loop substantially in the shape of square form a closed loop together with input coils in an 8-figured shape as a whole such that currents flow in the first and second pickup loops in directions opposite to each other. The second pickup coil is fabricated of a thin film on the substrate such that a third and a fourth pickup loop substantially in the shape of square form a closed loop together with input coils in an 8-figured shape as a whole such that the current flow in the third and fourth pickup loops in the direction opposite to each other.

The first differential SQUID is magnetically coupled to the first and second pickup loops through the input coils, and is formed of a first and a second superconducting loop connected in series or in parallel. The second differential SQUID is magnetically coupled to the third and fourth pickup loops through the input coils, and is formed of a third and a fourth superconducting loop connected in series or in parallel.

The first, second, third and fourth pickup loops and the first, second, third and fourth superconducting loops are fabricated of thin films on the same substrate so as to satisfy the following conditions (1), (2), (3) and (4):

(1) A first segment resulting from projecting a segment connecting the center of the first pickup loop with the center of the second pickup loop perpendicularly onto the surface of the substrate overlaps a second segment resulting from projecting a segment connecting the center of the first superconducting loop with the center of the second superconducting loop perpendicularly onto the surface of the substrate.

(2) A third segment resulting from projecting a segment connecting the center of the third pickup loop with the center of the fourth pickup loop perpendicularly onto the surface of the substrate overlaps a fourth segment resulting from projecting a segment connecting the center of the third superconducting loop with the center of the fourth superconducting loop perpendicularly onto the surface of the substrate.

(3) The first segment and the third segment cross at right angles.

(4) The midpoint the first segment, the midpoint of the second segment, the midpoint of the third segment, and the midpoint of the fourth segment match one another.

The gradiometer integrating pickup coils in the fourth feature is capable of simultaneously detecting field gradients in the z-direction with respect to the x-direction and the y-direction parallel with the surface of the substrate and perpendicular to the z-direction, in addition to the effects produced by the third feature.

The following description will be made on a fifth feature of the gradiometer integrating pickup coils in parallel pickup coil configuration. A first and a second pickup coil formed of superconducting loops and connected in series or in parallel, and a differential SQUID formed of a plurality of superconducting loops respectively connected in parallel with the first and second pickup coils are fabricated of thin films on a substrate. The first pickup coil and a plurality of superconducting loops connected in parallel therewith, and a second pickup coil and a plurality of superconducting loops connected in parallel therewith are fabricated of thin films on the same substrate symmetrically about the x-axis and the y-axis which are parallel with the surface of the substrate and perpendicular to the z-direction.

The gradiometer integrating pickup coils in the fifth feature is capable of detecting a field gradient in the z-direction with respect to the x-direction or the y-direction which is in parallel with the surface of the substrate and perpendicular to the z-direction. Since the pickup coils as well as the SQUID are fabricated of thin films, the gradiometer exhibits a high mechanical accuracy.

The following description will be made of a sixth feature of the gradiometer integrating pickup coils in parallel pickup coil configuration. A first and a second differential SQUID are fabricated of a thin film on the same substrate. The first differential SQUID, connected to a first and a second pickup coil, each formed of a superconducting loop, in series or in parallel, is formed of a plurality of superconducting loops which are connected respectively in parallel with the first and the second pickup coils. The second differential SQUID, connected to a third and a fourth pickup coil, each formed of a superconducting loop, in series or in parallel, is formed of a plurality of superconducting loops which are connected respectively in parallel with the third and fourth pickup coils.

The first and second differential SQUIDs are fabricated of a thin film on the same substrate so as to satisfy the following conditions (1), (2):

(1) A first segment resulting from projecting a segment connecting the center of the first pickup coil with the center of the second pickup coil perpendicularly onto the surface of the substrate, and a second segment resulting from projecting a segment connecting the center of the third pickup coil with the center of the fourth pickup coil perpendicularly onto the surface of the substrate cross at right angles.

(2) The midpoint of the first segment matches the midpoint of the second segment.

The gradiometer integrating pickup coils in the sixth feature is capable of simultaneously detecting field gradients in the z-direction with respect to the x-direction and the y-direction parallel with the surface of the substrate and perpendicular to the z-direction.

The gradiometer integrating pickup coils of the present invention can be fabricated on a single substrate in a simple structure, and readily installed within a cryostat.

BRIEF DESCRIPTION OF THE DRAWINGS

FIGS. 18A, 18B show an exemplary configuration of a multichannel gradiometer integrating pickup coils according to a sixth embodiment which has a plurality of gradiometers integrating pickup coils according to any of the first to the fifth embodiments on the same substrate, wherein FIG. 18A shows an example of 25 channels fabricated on a square substrate, and FIG. 18B shows an example of 37 channels fabricated on a circular substrate;

DETAILED DESCRIPTION OF THE EMBODIMENTS

Gradiometers integrating pickup coils according to embodiments of the present invention are each fabricated of thin films on a substrate. The following description employs a rectangular coordinate system (x, y, z) in which a plane parallel with the surface of the substrate is defined as an xy-plane, and a direction perpendicular to the substrate as a z-axis. The gradiometers integrating pickup coils according to embodiments of the present invention are configured to detect a gradient ($\Delta Bz/\Delta x$) with respect to the x-direction and/or a gradient ($\Delta Bz/\Delta y$) with respect to the y-direction of a magnetic field component (Bz) in the normal direction (which is defined as a z-direction).

(First Embodiment)

A first embodiment of the present invention provides a gradiometer integrating pickup coils in flux transformer configuration. The gradiometer according to the first embodiment is configured to simultaneously detect ($\Delta Bz/\Delta x$) and ($\Delta Bz/\Delta y$). In the following, the first embodiment will be described with reference to FIGS. 3 to 6. It should be noted that in these figures, partial alterations and omissions are made for purposes of explanation, and the dimensions are not necessarily on scale.

A superconductor in the present invention may be either a low-critical-temperature superconductor which operates at the temperature of liquid helium, or a high-critical-temperature superconductor which operates at a higher temperature. Strictly speaking, the structure of Josephson junction differs from one type to another of superconductor. However, since this aspect is not related to the present invention, a convenient structure will be represented for purposes of explanation.

Figure 1:
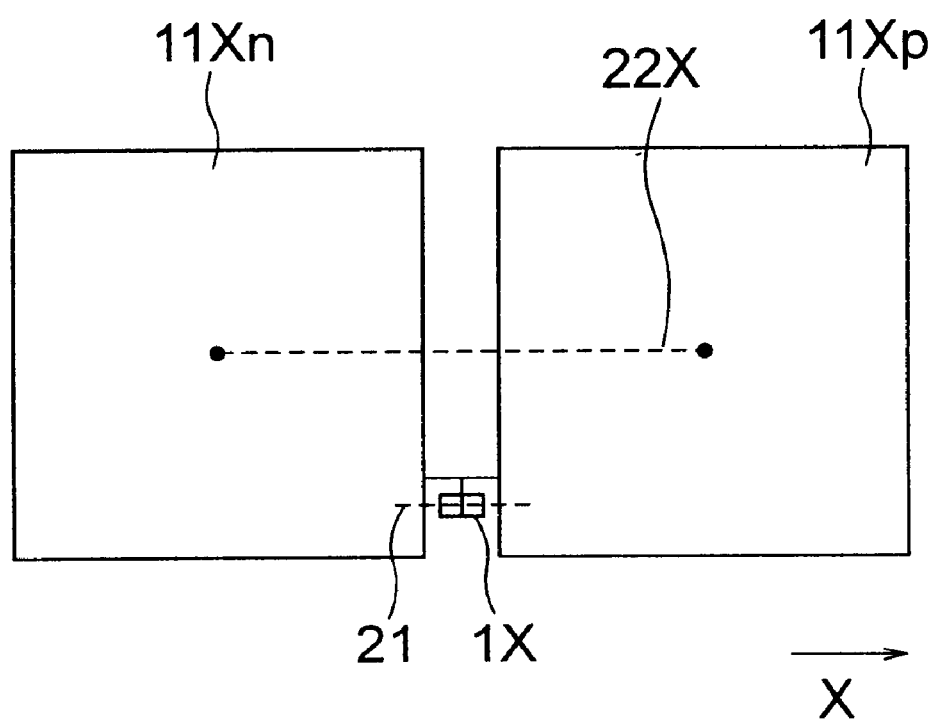
FIG. 1 is a diagram for generally explaining the configuration of a prior art example which has two pickup coils constituting a one-direction (x-direction) gradiometer and a differential SQUID fabricated on a single substrate.
Figure 2:
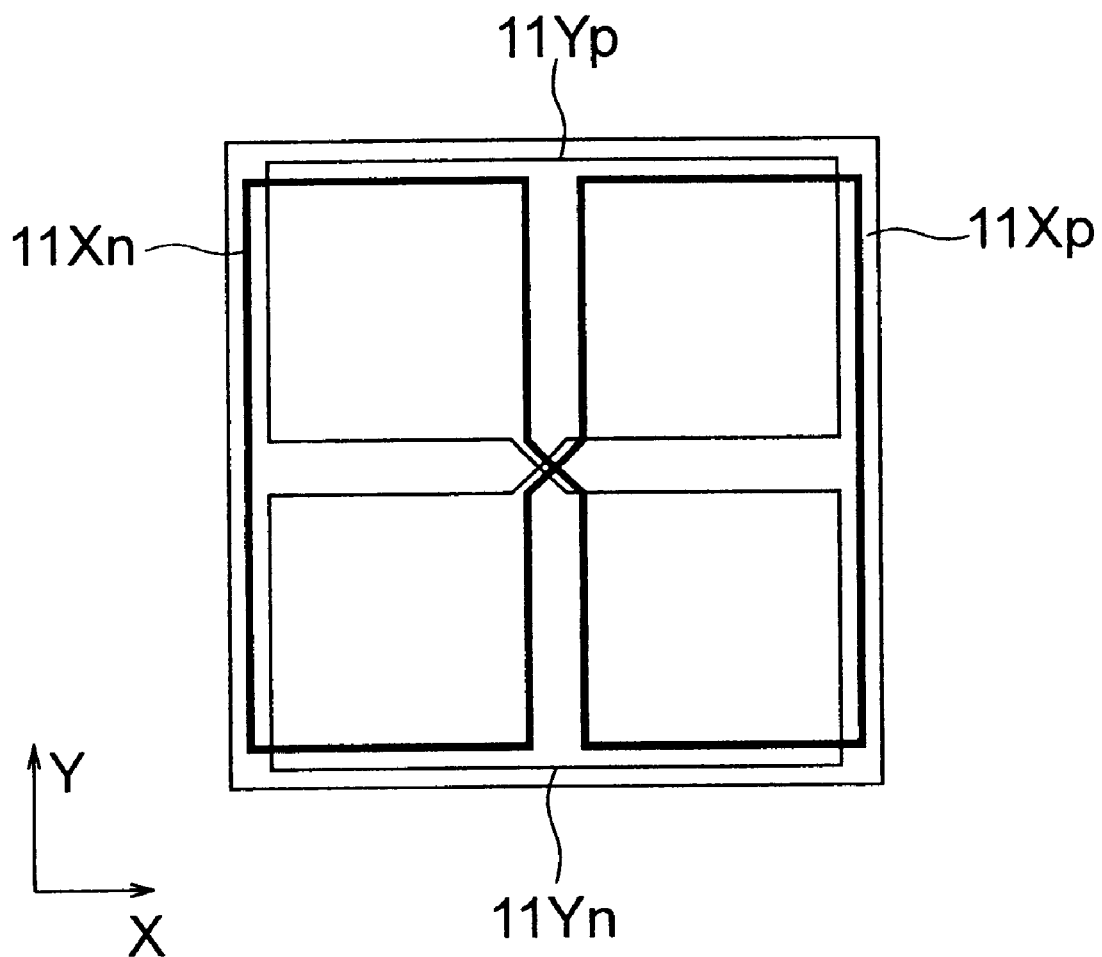
FIG. 2 is a diagram for generally explaining the configuration of a prior art example which has two rectangular pickup coils in x-and y-direction constituting a gradiometer.
Figure 3:
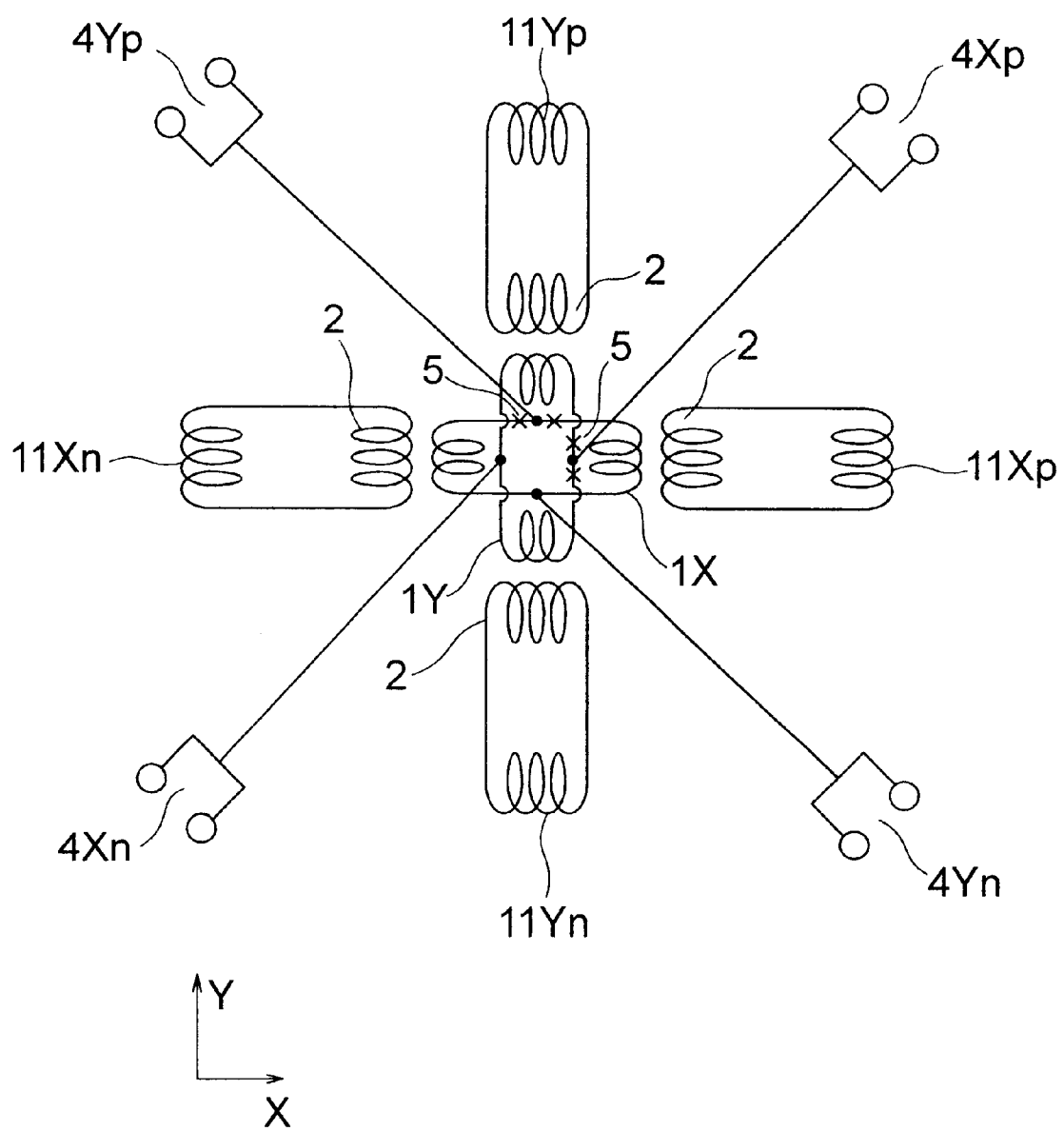
FIG. 3 is a diagram for explaining an equivalent circuit of a gradiometer integrating pickup coils in flux transformer configuration according to a first embodiment of the present invention.

FIG. 3 is a diagram for explaining an equivalent circuit of a gradiometer integrating pickup coils in flux transformer configuration according to the first embodiment. Pickup coils 11Xp, 11Xn are magnetically connected to a differential SQUID (1X) through input coils 2, while pickup coils 11Yp, 11Yn are magnetically connected to a differential SQUID (1Y) through input coils 2. The differential SQUIDs (1X, 1Y) are in a series configuration in which two superconducting loops are connected in series when viewed from Josephson junctions 5. The two series superconducting loops of the SQUIDs are magnetically coupled to the input coils 2, respectively, and the input coils 2 form superconducting closed loops together with the pickup coils 11Xp, 11Xn, 11Yp, 11Yn corresponding thereto.

Figure 4A:
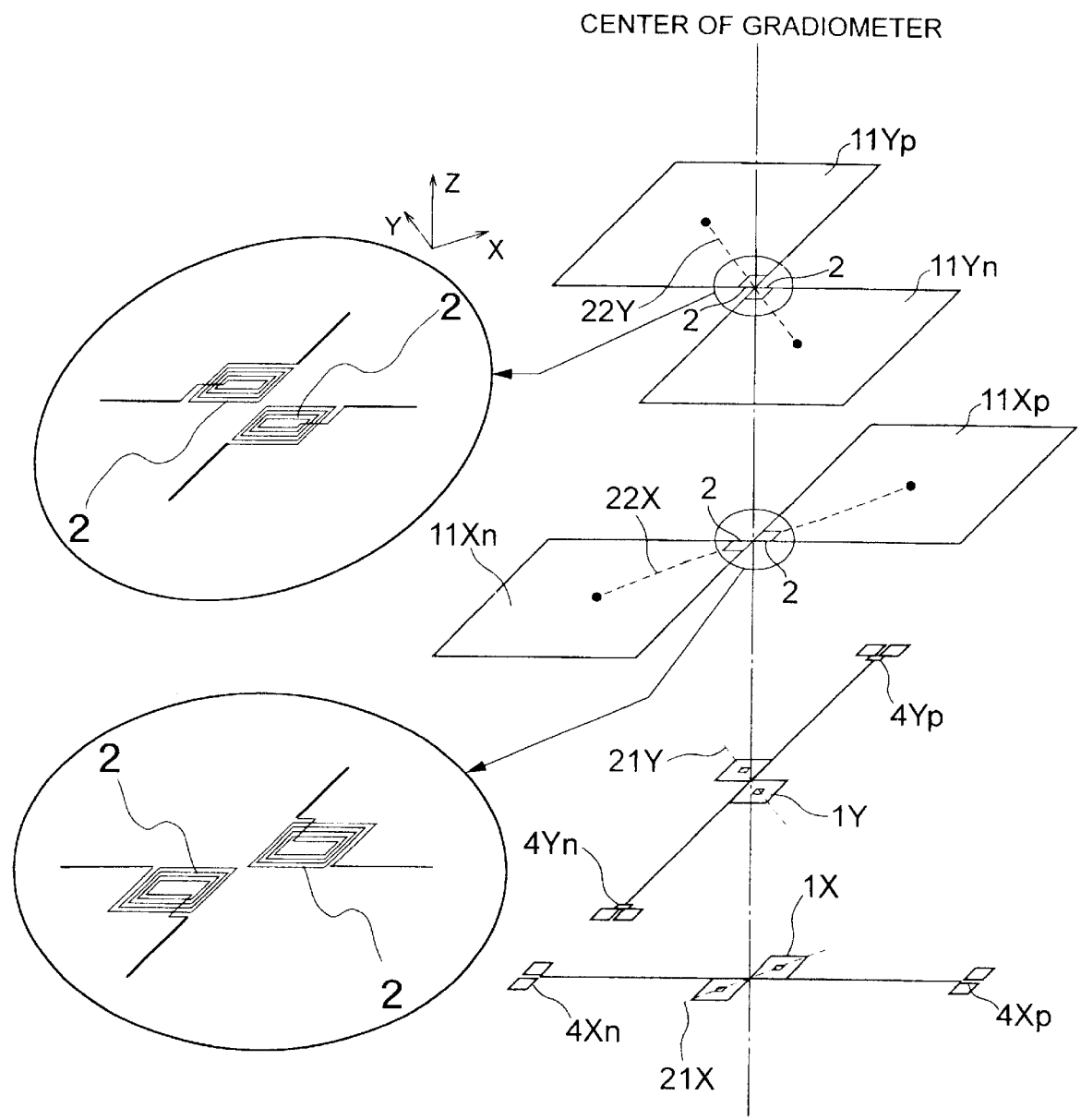
FIG. 4A is a diagram for explaining the structure of the gradiometer according to the first embodiment.
Figure 4B:
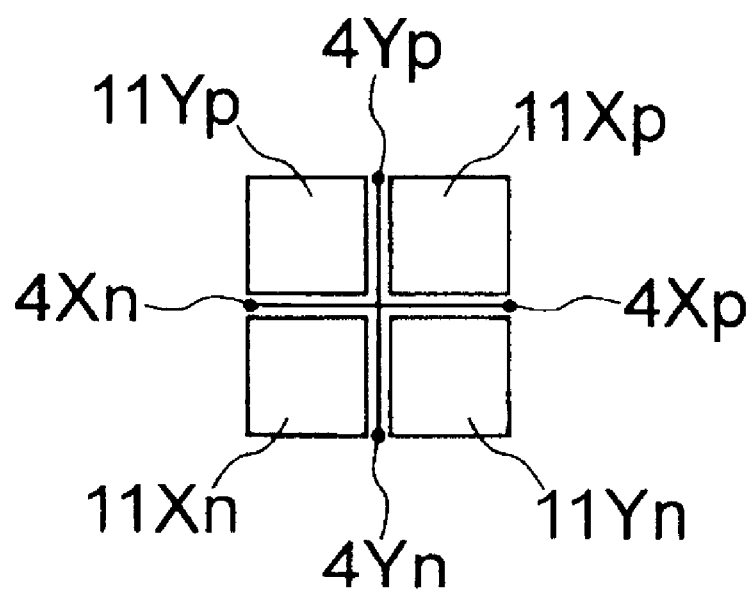
FIG. 4B is a diagram for explaining a positional relationship between pickup coils and pads of the gradiometer according to the first embodiment.
Figure 5A:
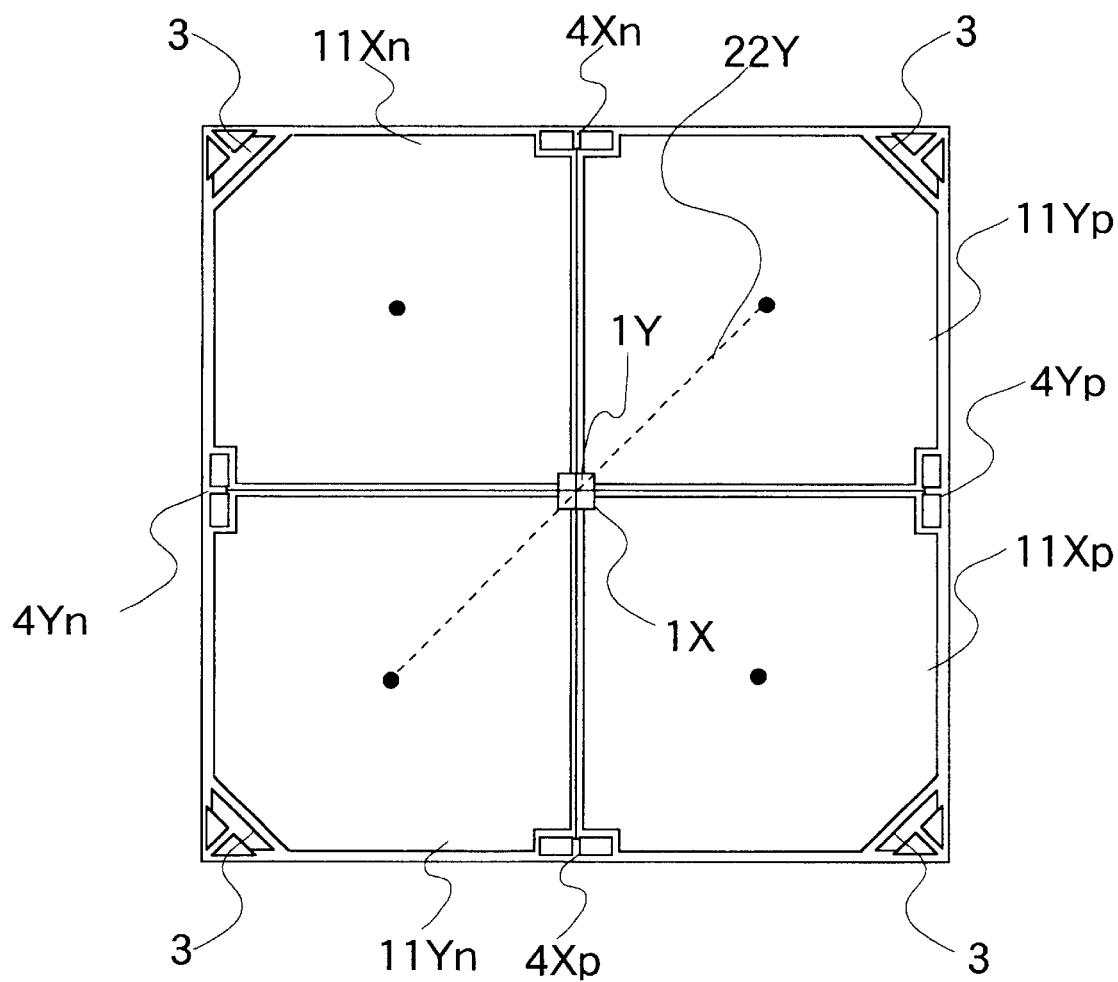
FIG. 5A is a diagram for explaining a positional relationship between pickup coils and SQUIDs of the gradiometer according to the first embodiment.

FIGS. 4A, 4B are diagrams for explaining the structure of the gradiometer according to the first embodiment. Specifically, FIGS. 4A, 4B show a positional relationship among the pickup coils, differential SQUIDs and input coils. FIG. 5A is a diagram for explaining a positional relationship between the pickup coils and the SQUIDs of the gradiometer according to the first embodiment and shows an outer appearance of the gradiometer. The center of the gradiometer generally in the shape of a square having one side of 15 mm matches the center of the differential SQUIDs. Feedback coils 3 are formed at four corners of a substrate in the shape of a square having one side of 15 mm on which the gradiometer is formed.

Each of the pickup coils 11Xp, 11Xn, 11Yp, 11Yn is generally in the shape of a square having one side of 7 mm. Each of the differential SQUIDs (1X, 1Y) and the input coils 2 is generally in the shape of a square having one side of 500 $\mu$m.

Figure 5B:
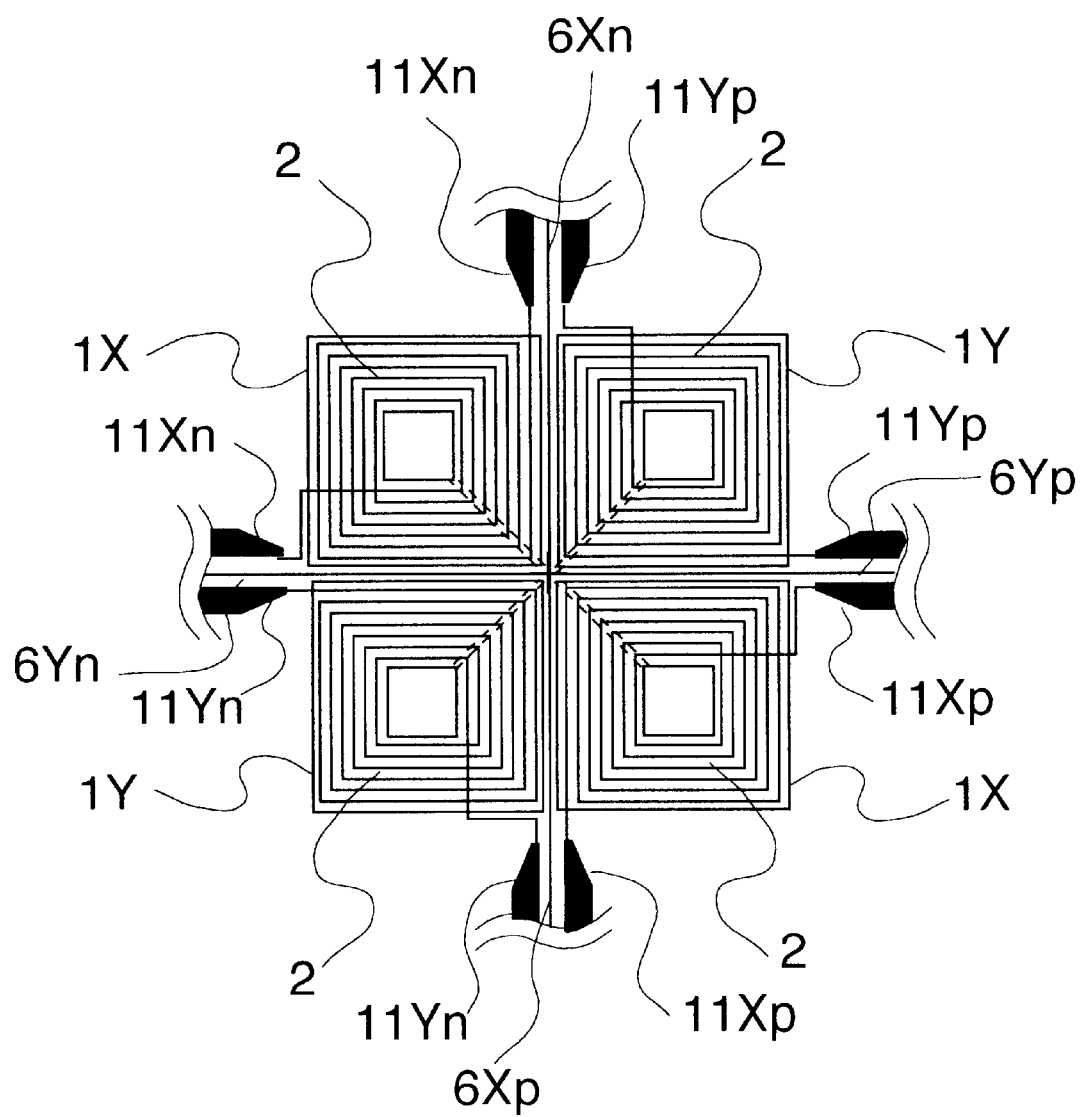
FIG. 5B is a diagram for explaining a positional relationship between input coils and the SQUIDs in a central portion of the gradiometer according to the first embodiment.

FIG. 5B is a diagram for explaining a positional relationship of the input coils and the SQUIDs in a central portion of the gradiometer according to the first embodiment. FIG. 5B shows four input coils 2 placed on the SQUIDs (1X, 1Y) which are positioned in the central portion of the gradiometer. FIG. 5B further shows parts of the pickup coils 11Xp, 11Xn, 11Yp, 11Yn and parts of current/voltage terminals 6Xp, 6Xn, 6Yp, 6Yn.

Figure 6:
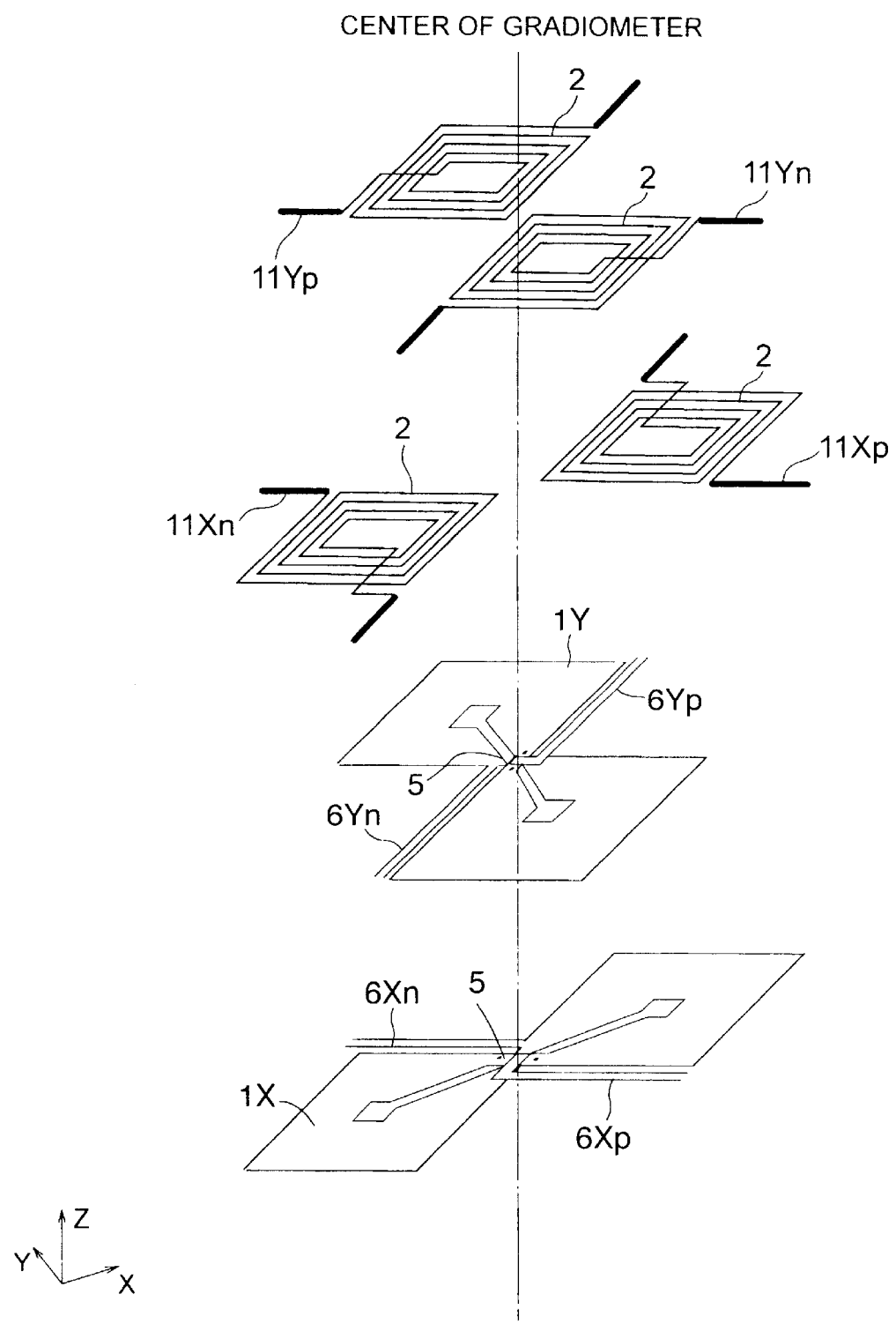
FIG. 6 is a diagram for explaining the structure of the central portion of the gradiometer according to the first embodiment, shown in FIGS. 4A, 4B.

FIG. 6 is a diagram for explaining the structure of the central portion of the gradiometer, shown in FIGS. 4A, 4B, according to the first embodiment, showing a positional relationship between the differential SQUIDs and the input coils. As shown in FIG. 6, the differential SQUIDs (1X, 1Y) are actually connected to form an 8-figured shape as a whole such that currents flow through two superconducting loops of the differential SQUID (1X) in opposite directions to each other, and such that currents flow through two superconducting loops of the differential SQUID (1Y) in opposite directions to each other, with respect to the application of a uniform field, to reduce environmental magnetic field noise.

The Josephson junctions 5 are positioned at the intersection of the 8-figured shape. Current/voltage terminals 6Xp, 6Xn are connected to the differential SQUID (1X), while current/voltage terminals 6Yp, 6Yn are connected to the differential SQUID (1Y). The current/voltage terminal 6Xp is connected to a pad 4Xp; the current/voltage terminal 6Xn to a pad 4Xn; the current/voltage terminal 6Yp to a pad 4Yp; and the current/voltage terminal 6Yn to a pad 4Yn.

Referring to FIG. 4A, a line segment connecting the centers of the respective pickup coils 11Xp, 11Xn in the x-direction is projected onto the surface of the substrate (parallel with the xy-plane) to define an axial segment 22X of the pickup coils in the x-direction, while a line segment connecting the centers of the respective pickup coils 11Yp, 11Yn in the y-direction is projected onto the surface of the substrate to define an axial segment 22Y of the pickup coils in the y-direction.

A line segment connecting the centers of respective two superconducting loops (SQUID holes) constituting the differential SQUID (1X) in the x-direction is projected onto the surface of the substrate to define an axial segment 21X of the differential SQUID in the x-direction, while a line segment connecting the centers of respective two superconducting loops (SQUID holes) constituting the differential SQUID (1Y) in the y-direction is projected onto the surface of the substrate to define an axial segment 21Y of the differential SQUID in the y-direction. It should be noted that in FIG. 4, the axial segments 21X, 21Y are drawn longer than the actually defined lengths.

The axial segment 22X of the pickup coils overlaps the axial segment 21X of the SQUID on the surface of the substrate. The midpoint of the axial segment 22X of the pickup coils and the midpoint of the axial segment 21X of the SQUID match the center of the gradiometer. The axial segment 22Y of the pickup coils overlaps the axial segment 21Y of the SQUID on the surface of the substrate. The midpoint of the axial segment 22Y of the pickup coil and the midpoint of the axial segment 21Y of the SQUID match the center of the gradiometer.

As shown in FIGS. 3 to 6, in the gradiometer according to the first embodiment, x-direction and y-direction gradiometers are fabricated on a single substrate such that the center of the x-direction gradiometer matches the center of the y-direction gradiometer, so that ($\Delta Bz/\Delta x$) and ($\Delta Bz/\Delta y$) are simultaneously detected.

Alternatively, an x-direction gradiometer or a y-direction gradiometer, each comprised of a set of pickup coils and a SQUID, may be fabricated alone on a single substrate to separately detect ($\Delta Bz/\Delta x$) or ($\Delta Bz/\Delta y$).

(Second Embodiment)

A second embodiment of the present invention provides a gradiometer integrating pickup coils in flux transformer configuration. The gradiometer according to the second embodiment is configured to simultaneously detect ($\Delta Bz/\Delta x$) and ($\Delta Bz/\Delta y$).

Figure 7:
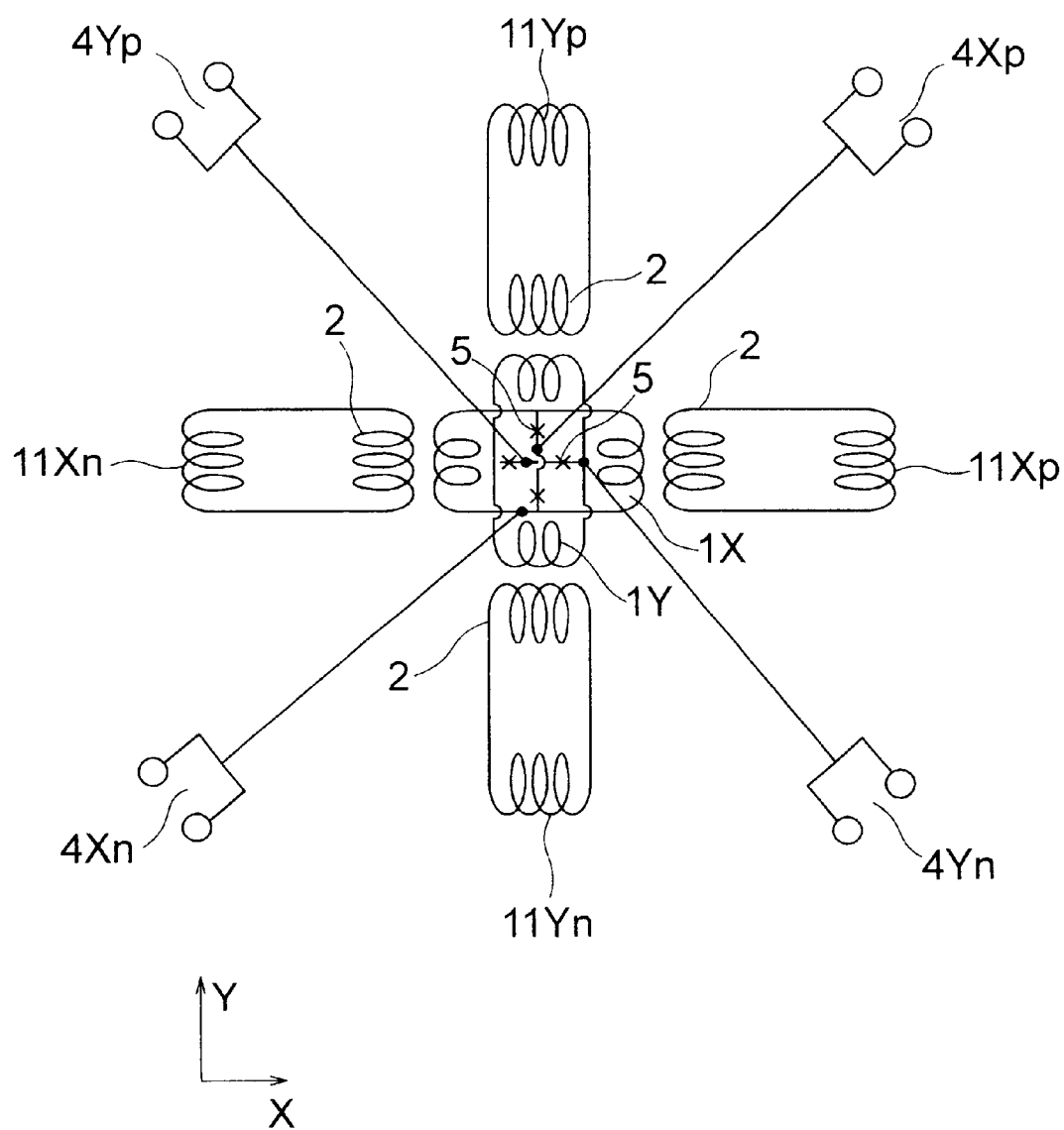
FIG. 7 is a diagram for explaining an equivalent circuit of a gradiometer integrating pickup coils in flux transformer configuration according to a second embodiment of the present invention.

FIG. 7 is a diagram for explaining an equivalent circuit of the gradiometer integrating pickup coils in flux transformer configuration according to the second embodiment. Pickup coils 11Xp, 11Xn are magnetically connected to a differential SQUID (1X) through input coils 2, while pickup coils 11Yp, 11Yn are magnetically connected to a differential SQUID (1Y) through input coils 2. The differential SQUIDs (1X, 1Y) are in a parallel configuration in which two superconducting loops are connected in parallel when viewed from Josephson junctions 5.

Figure 8:
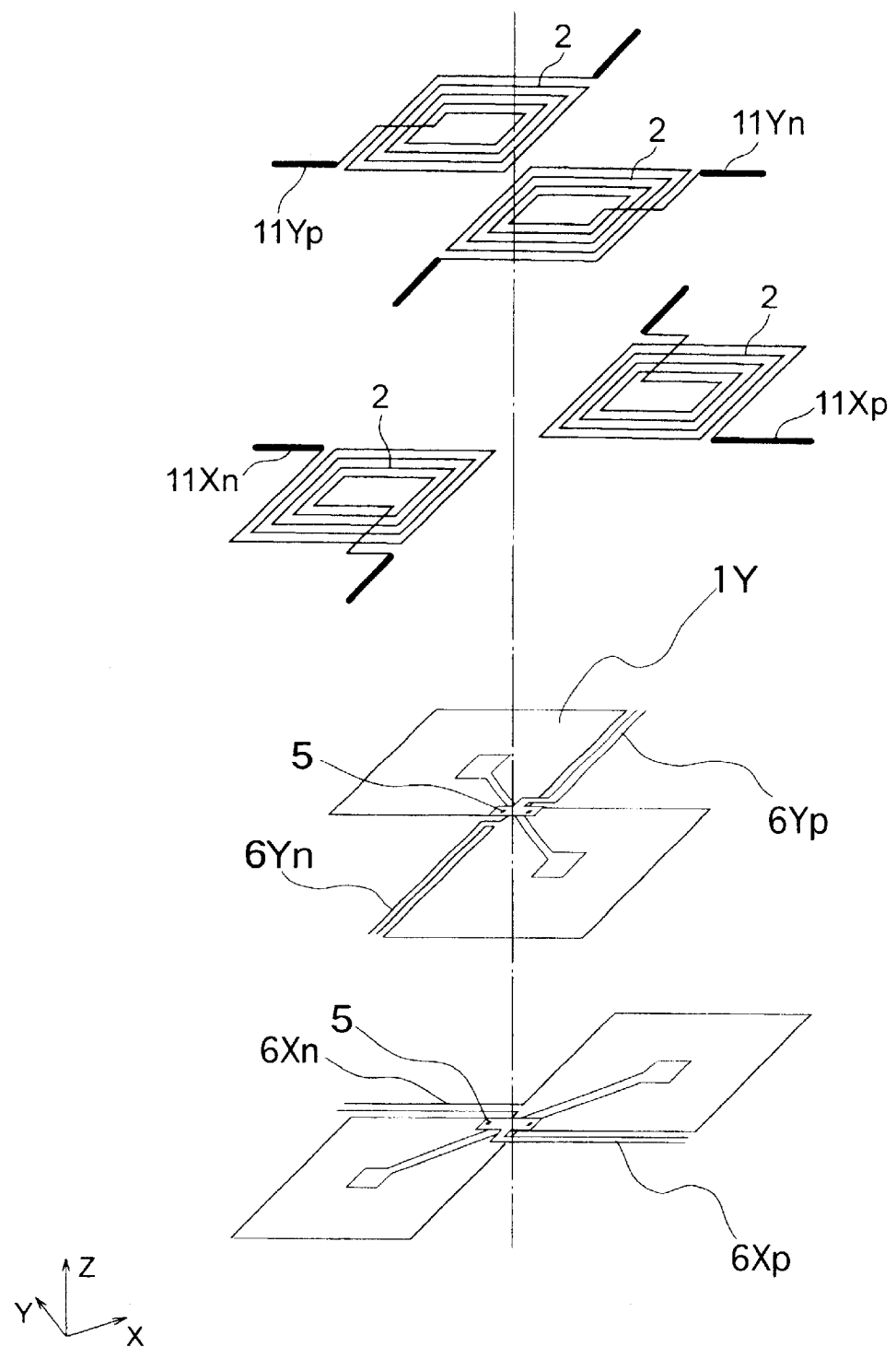
FIG. 8 is a diagram for explaining the structure of a central portion of the gradiometer integrating pickup coils according to the second embodiment shown in FIG. 7.

FIG. 8 is a diagram for explaining the structure of a central portion of the gradiometer according to the second embodiment shown in FIG. 7, showing a positional relationship between the differential SQUIDs and the input coils. The second embodiment is basically identical in configuration to the first embodiment, but differs, as shown in FIG. 7, in that two superconducting loops of the respective SQUIDs (1X, 1Y) are connected in parallel, instead of in series, when viewed from the Josephson junctions 5. As shown in FIG. 8, the Josephson junctions 5 are respectively positioned to straddle a slit which couples holes of two superconducting loops of each SQUID (1X, 1Y).

(Third Embodiment)

A third embodiment of the present invention provides a gradiometer integrating pickup coils in flux transformer configuration. The gradiometer integrating pickup coils according to the third embodiment is configured to simultaneously detect ($\Delta Bz/\Delta x$) and ($\Delta Bz/\Delta y$).

Figure 9:
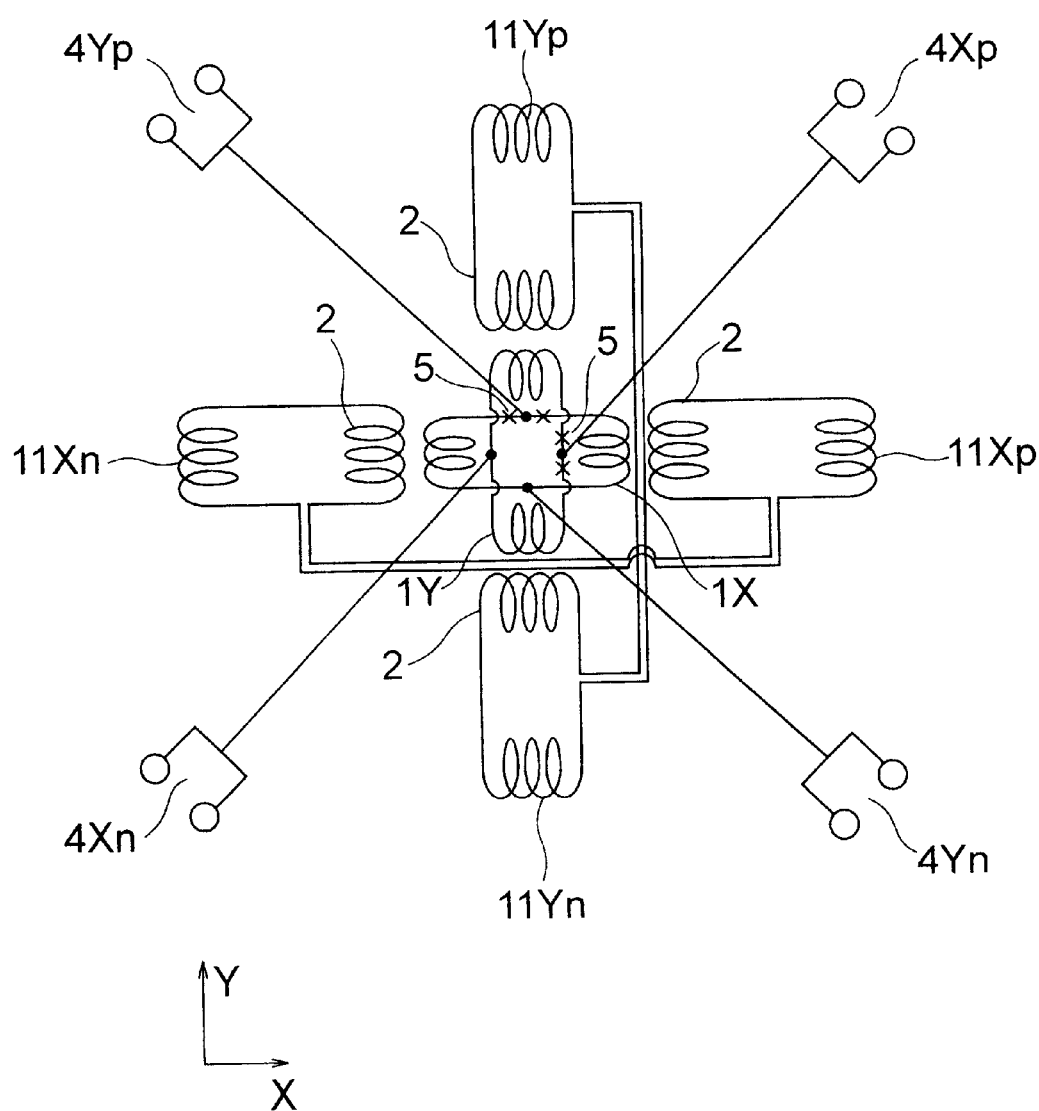
FIG. 9 is a diagram for explaining an equivalent circuit of a gradiometer integrating pickup coils in flux transformer configuration according to a third embodiment of the present invention.

FIG. 9 is a diagram for explaining an equivalent circuit of the gradiometer integrating pickup coils in flux transformer configuration according to the third embodiment. Pickup coils 11Xp, 11Xn are magnetically coupled to a differential SQUID (1X) through input coils 2, while pickup coils 11Yp, 11Yn are magnetically coupled to a differential SQUID (1Y) through input coils 2. Loops formed of the pickup coils 11Xp, 11Xn are connected in series to form an 8-figured shape as a whole such that currents flow through the loops in opposite directions to each other with respect to the application of a uniform field. Likewise, loops formed of the pickup coils 11Yp, 11Yn are connected in series to form an 8-figured shape as a whole such that currents flow through the loops in opposite directions to each other with respect to the application of a uniform field.

Figure 10:
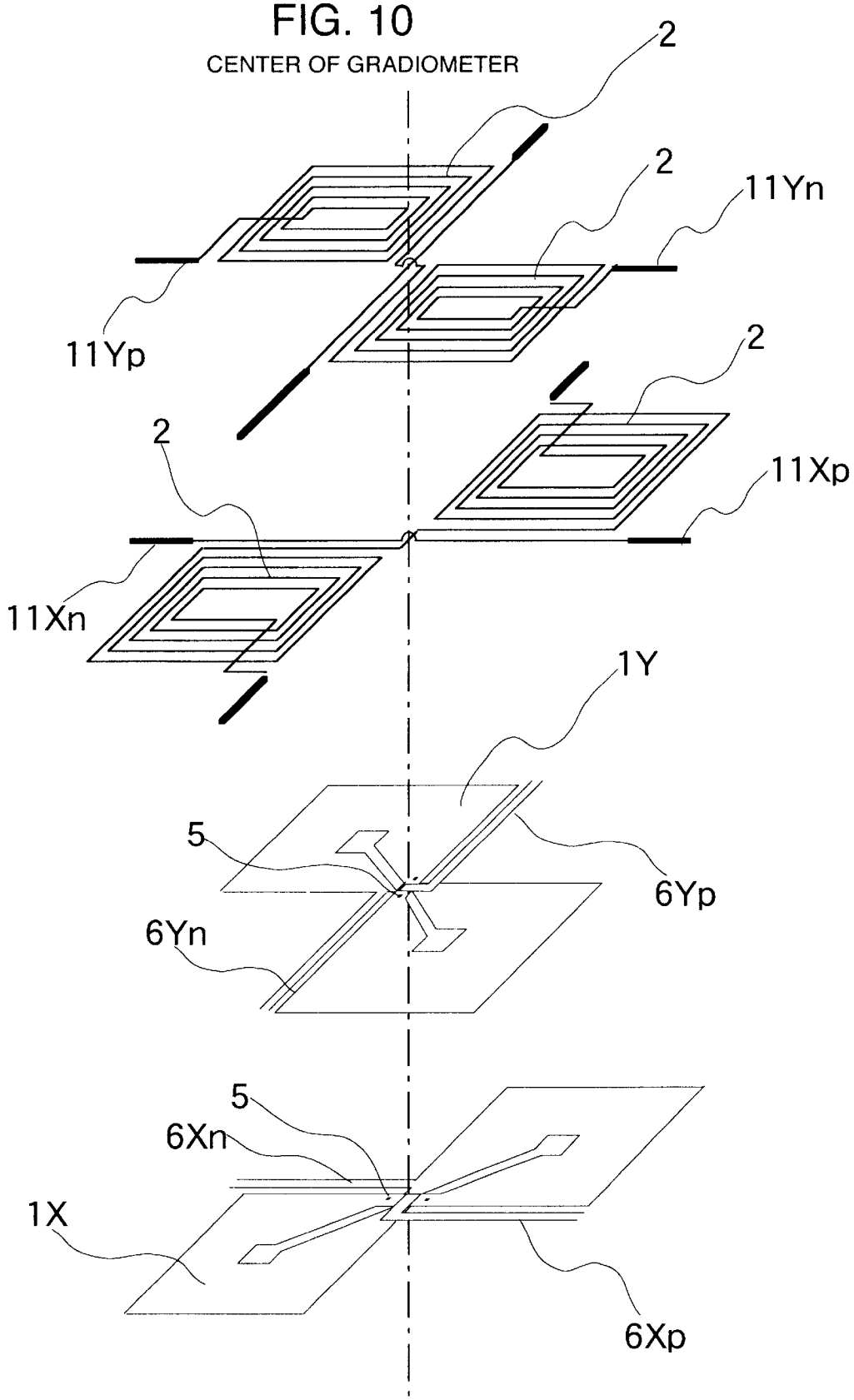
FIG. 10 is a diagram for explaining the structure of a central portion of the gradiometer according to the third embodiment shown in FIG. 9.

FIG. 10 is a diagram for explaining the structure of a central portion of the gradiometer according to the third embodiment shown in FIG. 9, showing a positional relationship between the differential SQUIDs and the input coils. The input coils 2 associated with the respective pickup coils 11Xp, 11Xn are mutually connected to form a single loop which has an 8-figured shape for detecting a field gradient in the magnetic field. The differential SQUIDs (1X, 1Y) are in a series configuration in which two superconducting loops are connected in series, when viewed from the Josephson junctions 5.

The third embodiment is basically identical in configuration to the first embodiment, but differs from the first embodiment, as shown in FIG. 9, in that the pickup coils 11Xp, 11Xn in the x-direction are connected in series, and that the pickup coils 11Yp, 11Yn in the y-direction are connected in series. As an uniform field is applied to the series connected pickup coils in the x-direction, currents flow through the pickup coils 11Xp, 11Xn in directions opposite to each other to detect a field gradient in the x-direction of the magnetic field. On the other hand, as an uniform field is applied to the serially connected pickup coils in the y-direction, currents flow through the pickup coils 11Yp, 11Yn in directions opposite to each other to detect a field gradient in the y-direction of the magnetic field. The SQUIDs are in series configuration.

(Fourth Embodiment)

A fourth embodiment of the present invention provides a gradiometer integrating pickup coils in flux transformer configuration. The gradiometer according to the fourth embodiment is configured to simultaneously detect ($\Delta Bz/\Delta x$) and ($\Delta Bz/\Delta y$).

Figure 11:
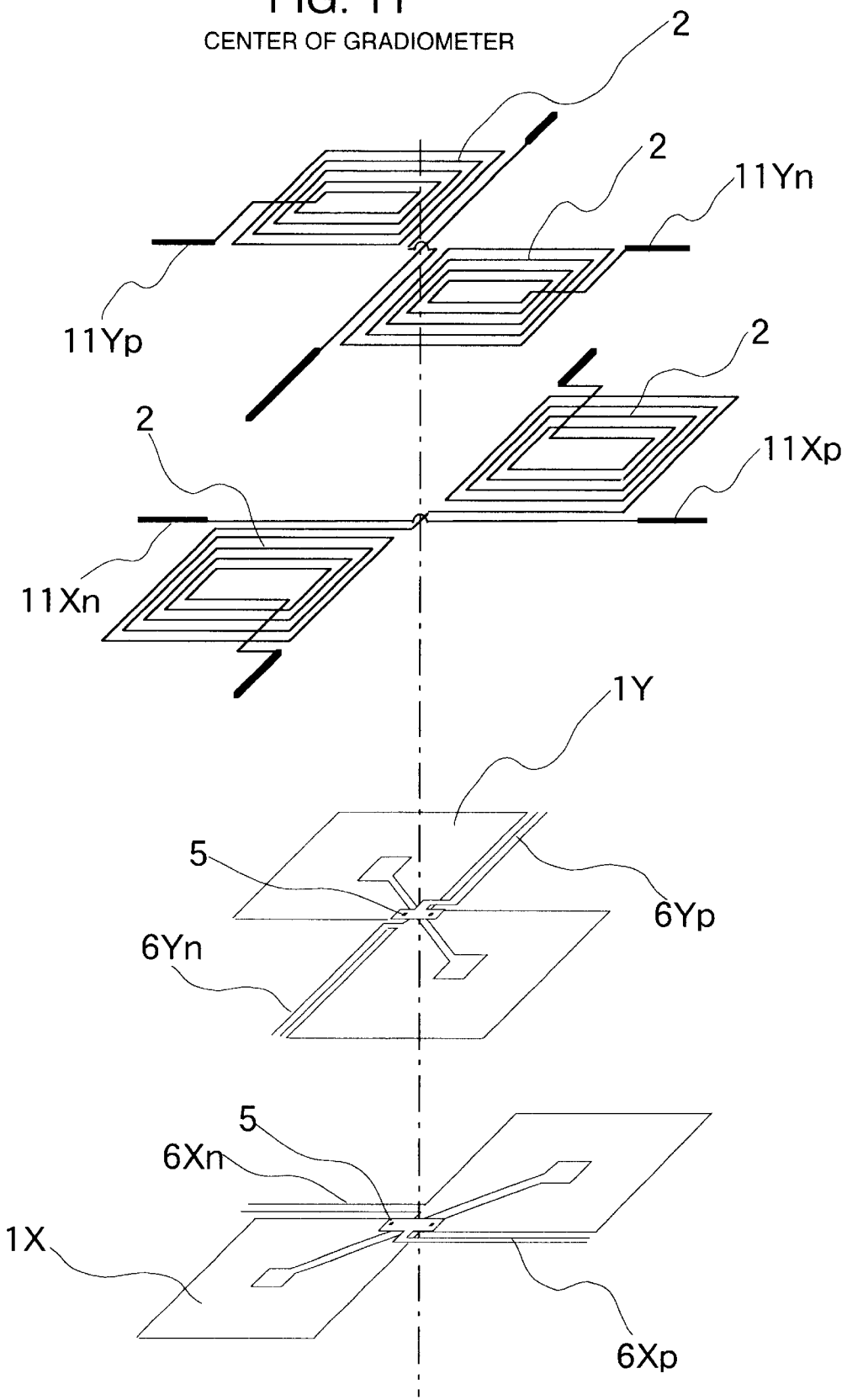
FIG. 11 is a diagram for explaining the structure of a central portion of a gradiometer integrating pickup coils in flux transformer configuration according to a fourth embodiment of the present invention.

FIG. 11 is a diagram for explaining the structure of a central portion of the gradiometer integrating pickup coils in flux transformer configuration according to the fourth embodiment, showing a positional relationship between differential SQUIDs and input coils. Pickup coils in the x-direction and y-direction are identical in structure to those of the third embodiment. The differential SQUIDs are in parallel configuration in which two superconducting loops are connected in parallel, when viewed from Josephson junctions 5. The fourth embodiment is basically identical in configuration to the third embodiment, but differs from the third embodiment in that the SQUIDs are in parallel configuration.

(Fifth Embodiment)

A fifth embodiment of the present invention provides a gradiometer integrating pickup coils in parallel pickup coil configuration. In the fifth embodiment, a plurality of parallel pickup coils directly form a group of superconducting loops of differential SQUIDs. The gradiometer according to the fifth embodiment is configured to separately detect ($\Delta Bz/\Delta x$) or ($\Delta Bz/\Delta y$) or to simultaneously detect ($\Delta Bz/\Delta x$) and ($\Delta Bz/\Delta y$).

Figure 12:
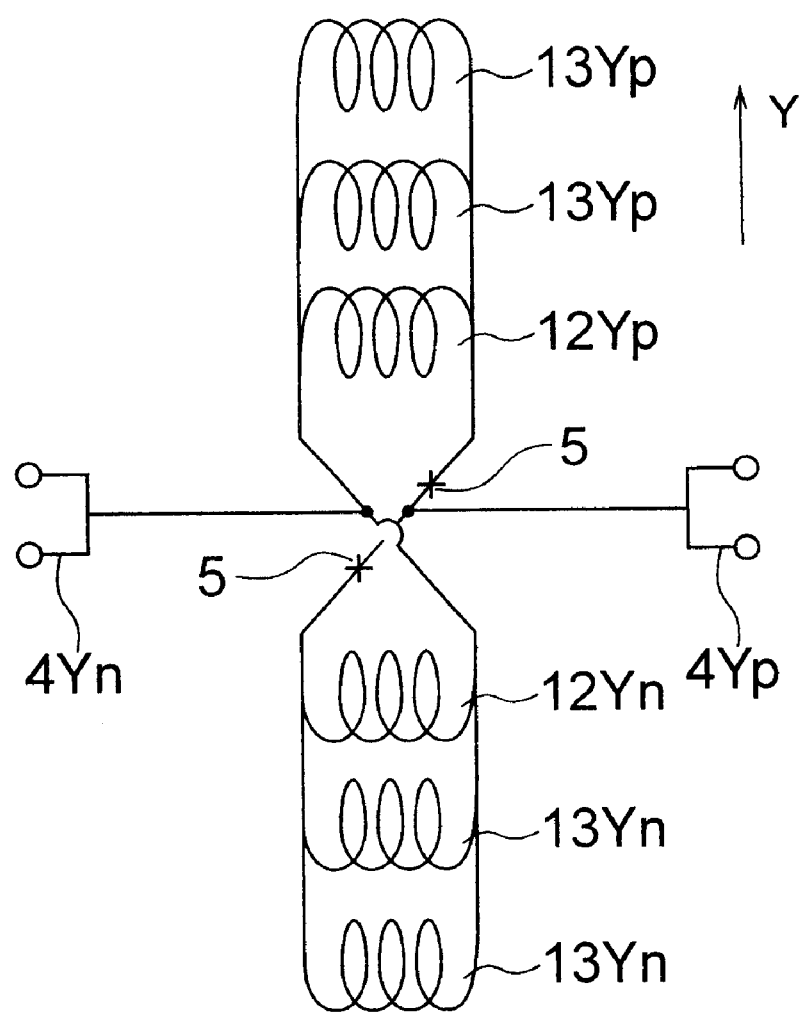
FIG. 12 is a diagram for explaining an equivalent circuit of a gradiometer integrating pickup coils for detecting ($\Delta Bz/\Delta y$) in a fifth embodiment of the present invention.

FIGS. 12 to 17 are diagrams for explaining the configuration of the gradiometer integrating pickup coils according to the fifth embodiment. FIG. 12 is a diagram for explaining an equivalent circuit of the gradiometer integrating pickup coils according to the fifth embodiment for detecting ($\Delta Bz/\Delta y$). A plurality of parallel pickup coils 12Yp, 12Yn in the y-direction, and superconducting loops 13Yp, 13Yn are in series configuration in which they are connected in series, when viewed from Josephson junctions 5.

Figure 13:
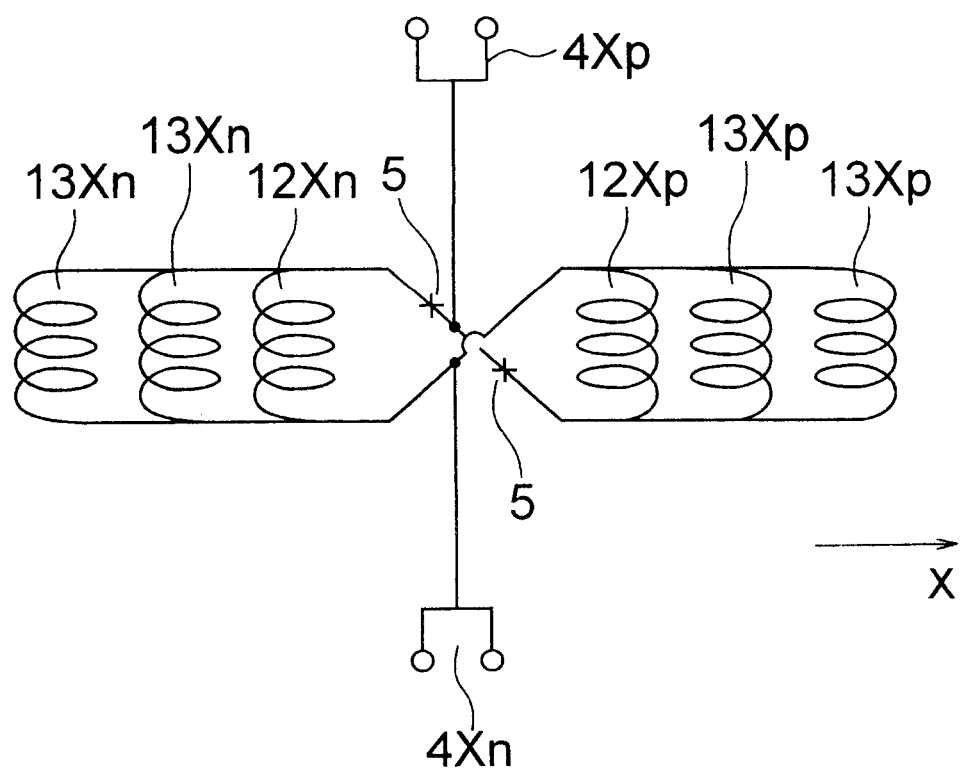
FIG. 13 is a diagram for explaining an equivalent circuit of the gradiometer integrating pickup coils for detecting ($\Delta Bz/\Delta x$) in the fifth embodiment of the present invention.

FIG. 13 is a diagram for explaining an equivalent circuit of the gradiometer integrating pickup coils according to the fifth embodiment for detecting ($\Delta Bz/\Delta x$). A plurality of parallel pickup coils 12Xp, 12Xn in the x-direction, and superconducting loops 13XP, 13Xn are in series configuration in which they are connected in series, when viewed from the Josephson junctions 5. Equivalent circuits of FIGS. 12 and 13 may be combined to create an equivalent circuit shown in FIG. 16, later described.

Figure 14:
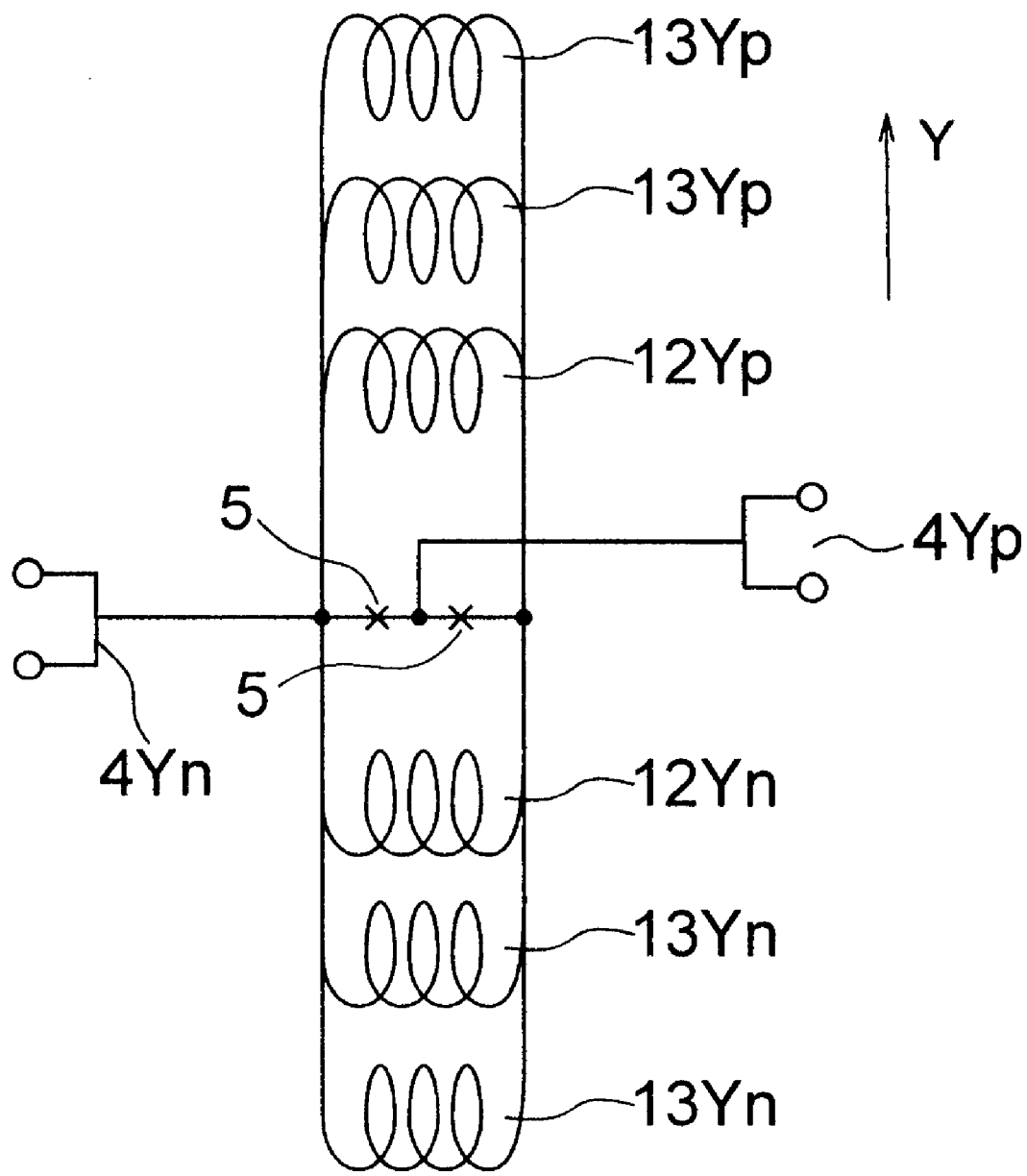
FIG. 14 is a diagram for explaining an equivalent circuit of the gradiometer integrating pickup coils for detecting ($\Delta Bz/\Delta y$) in the fifth embodiment of the present invention.

FIG. 14 is a diagram showing an equivalent circuit of the gradiometer integrating pickup coils according to the fifth embodiment for detecting ($\Delta Bz/\Delta y$). The plurality of parallel pickup coils 12Yp, 12Yn in the y-direction, and the superconducting loops 13Yp, 13Yn are in parallel configuration in which they are connected in parallel, when viewed from the Josephson junctions 5.

Figure 15:
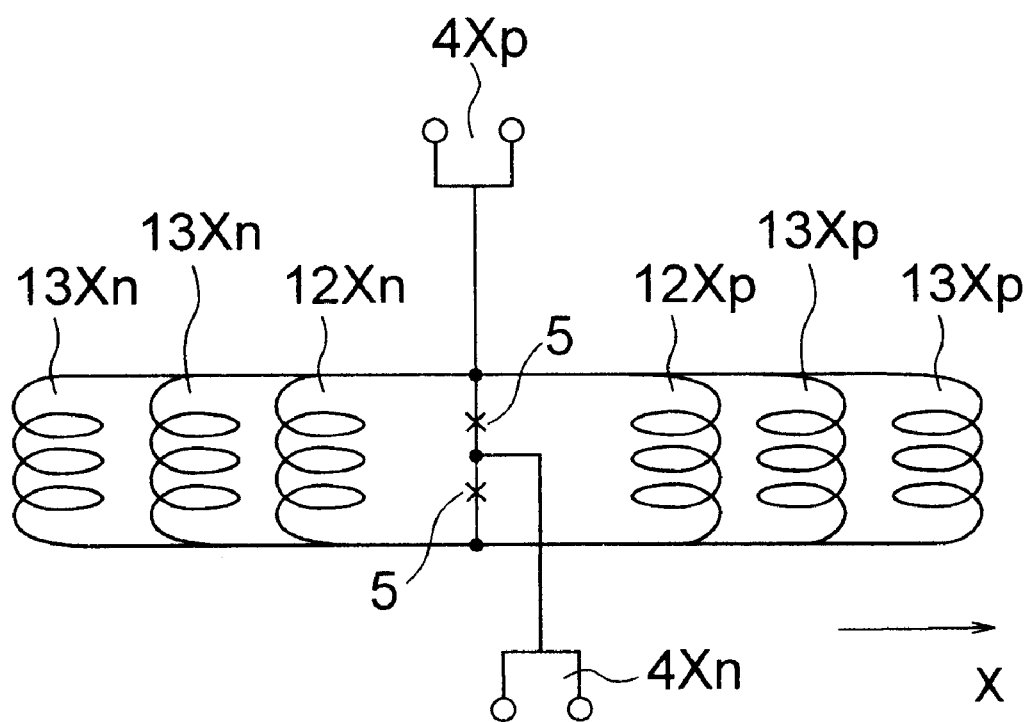
FIG. 15 is a diagram for explaining an equivalent circuit of the gradiometer integrating pickup coils for detecting ($\Delta Bz/\Delta x$) in the fifth embodiment of the present invention.

FIG. 15 is a diagram showing an equivalent circuit of the gradiometer integrating pickup coils according to the fifth embodiment for detecting ($\Delta Bz/\Delta x$). The plurality of parallel pickup coils 12Xp, 12Xn in the x-direction, and the superconducting loops 13Xp, 13Xn are in parallel configuration in which they are connected in parallel, when viewed from the Josephson junctions 5.

Figure 16:
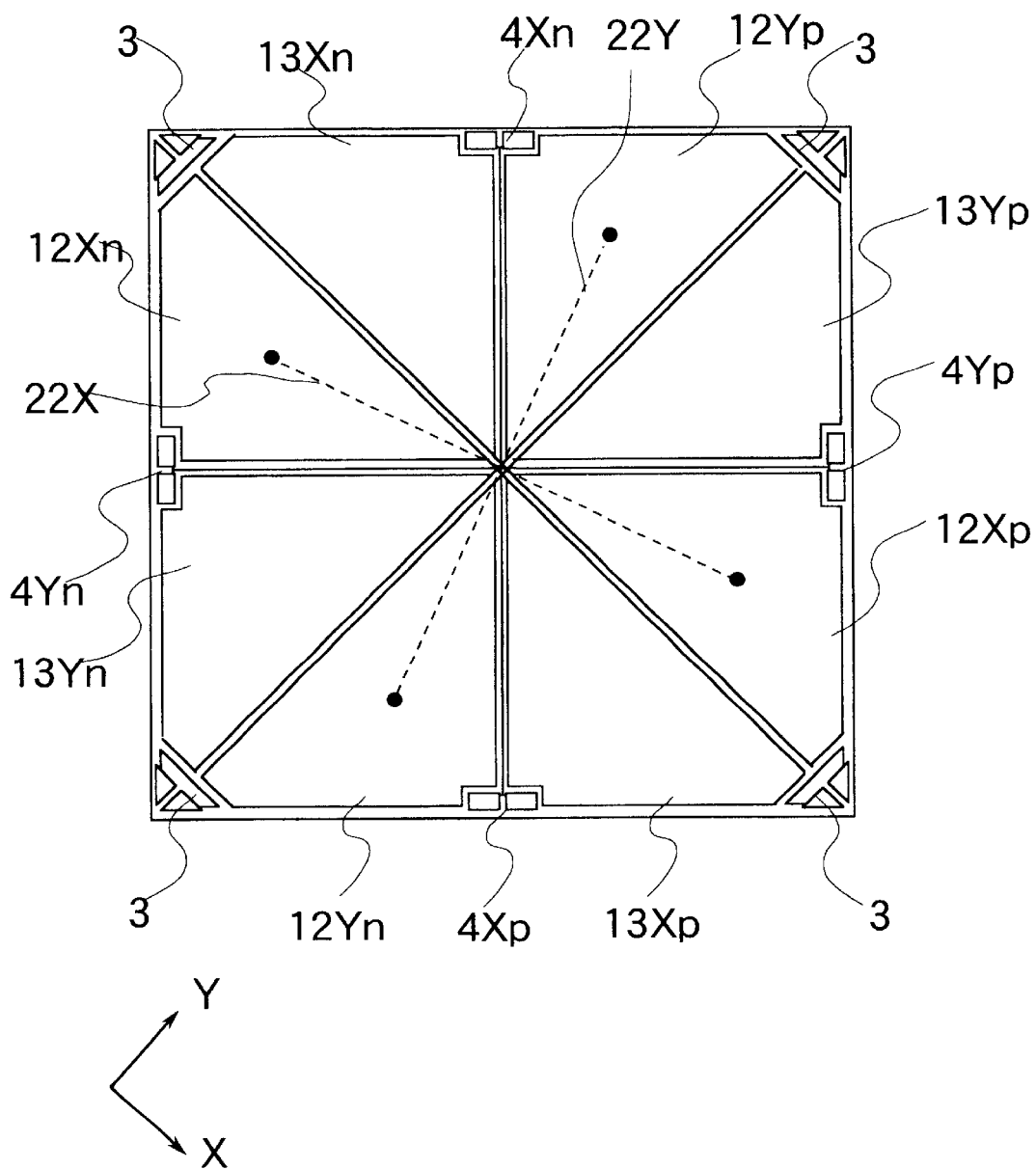
FIG. 16 is a diagram illustrating an outer appearance of a gradiometer for detecting ($\Delta Bz/\Delta x$) and ($\Delta Bz/\Delta y$) in the fifth embodiment of the present invention, for showing a positional relationship between pickup coils and a SQUID.

FIG. 16 is a diagram illustrating an outer appearance of the gradiometer for detecting ($\Delta Bz/\Delta x$) and ($\Delta Bz/\Delta y$) in the fifth embodiment of the present invention, for showing a positional relationship between the pickup coils and the SQUIDs. The center of the gradiometer generally in the shape of a square having one side of 15 mm matches the center of the differential SQUIDs. Feedback coils 3 are formed at four corners of a substrate in the shape of a square having one side of 15 mm on which the gradiometer is formed. Each of the pickup coils 12Xp, 12Xn, 12Yp, 12Yn and the conducting loops 13Yp, 13Yn, 13Xp, 13Xn is generally in the shape of an isosceles triangle which has the base of approximately 10 mm and the other sides of 7 mm.

Figure 17:
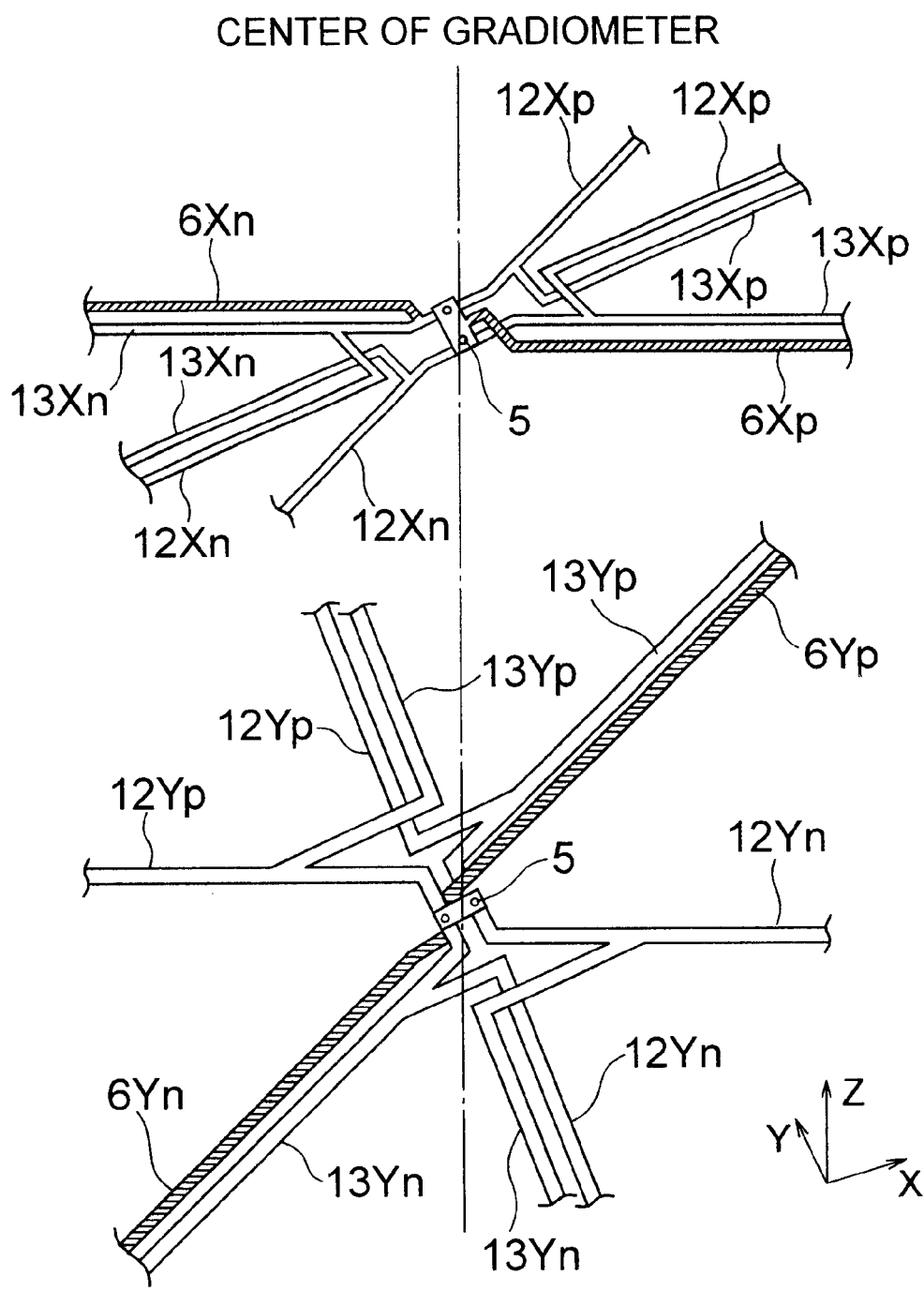
FIG. 17 is a diagram for explaining the structure of a central portion of the gradiometer according to the fifth embodiment shown in FIG. 16.

FIG. 17 is a diagram for explaining the structure of a central portion of the gradiometer according to the fifth embodiment shown in FIG. 16. Wires 6Xp, 6Xn, 6Yp, 6Yn not involved in detecting magnetic fields are distinguished by hatchings. In the fifth embodiment, the superconducting loops (FIG. 12) of the SQUIDs formed by the pickup coils 12Yp, 12Yn, and superconducting loops (FIG. 13) of the SQUIDs formed by the pickup coils 12Xp, 12Xn are respectively connected in series to form an 8-figured shape, as viewed from the Josephson junctions 5 (FIGS. 12, 13).

On the other hand, the superconducting loops (FIG. 14) of the SQUIDs formed by the pickup coils 12Yp, 12Yn, and the superconducting loops (FIG. 15) of the SQUIDs formed by the pickup coils 12Xp, 12Xn are respectively connected in parallel, as viewed from the Josephson junctions 5 (FIGS. 14, 15, 17).

In the fifth embodiment shown in FIGS. 12 to 17, the superconducting loop of each SQUID is further connected to another superconducting loop 13Yp, 13Yn, 13Xp, 13Xn in parallel. The other superconducting loop itself serves as a pickup coil and is not distinguished from the superconducting loop of the SQUID.

As shown in FIGS. 16, 17, the differential SQUIDs in the x-direction and y-direction are fabricated of thin films on the same substrate.

In the differential SQUID in the x-direction, the first pickup coil 12Xp and the second pickup coil 12Xn, each formed of a superconducting loop, are connected in series or in parallel. One superconducting loop 13Xp is connected in parallel with the first pickup coil 12Xp, while one superconducting loop 13Xn is connected in parallel with the second pickup coil 12Xn.

In the differential SQUID in the y-direction, the third pickup coil 12Yp and the fourth pickup coil 12Yn, each formed of a superconducting loops, are connected in series or in parallel. One superconducting loop 13Yp is connected in parallel with the third pickup coil 12Yp, while one superconducting loop 13Yn is connected in parallel with the fourth pickup coil 12Yn.

The differential SQUIDs in the x-direction and y-direction are formed of a thin film on the same substrate to satisfy the following conditions (1), (2).

(1) A first segment resulting from perpendicular projection of a segment 22X connecting the center of the first pickup coil 12Xp with the center of the second pickup coil 12Xn onto the surface of the substrate, and a second segment 22Y resulting from perpendicular projection of a segment connecting the center of the third pickup coil 12Yp with the center of the fourth pickup coil 12Yn onto the surface of the substrate cross at right angles.

(2) The midpoint of the first segment 22X matches the midpoint of the second segment 22Y.

(Sixth Embodiment)

Figure 18A:
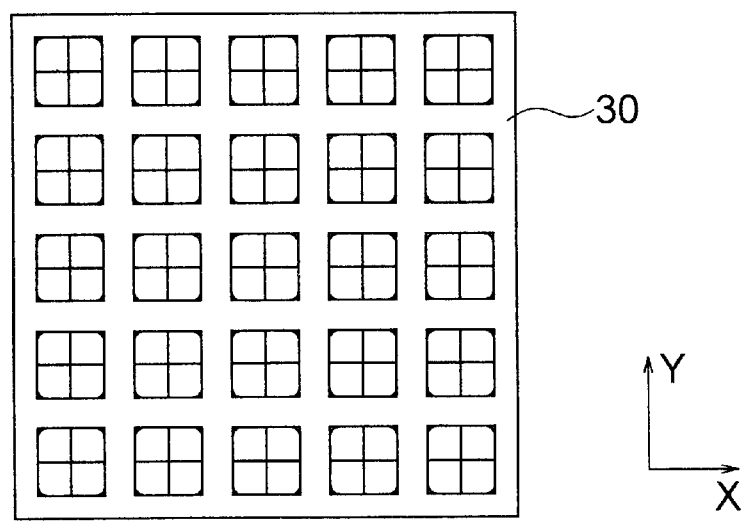
Figure 18B:
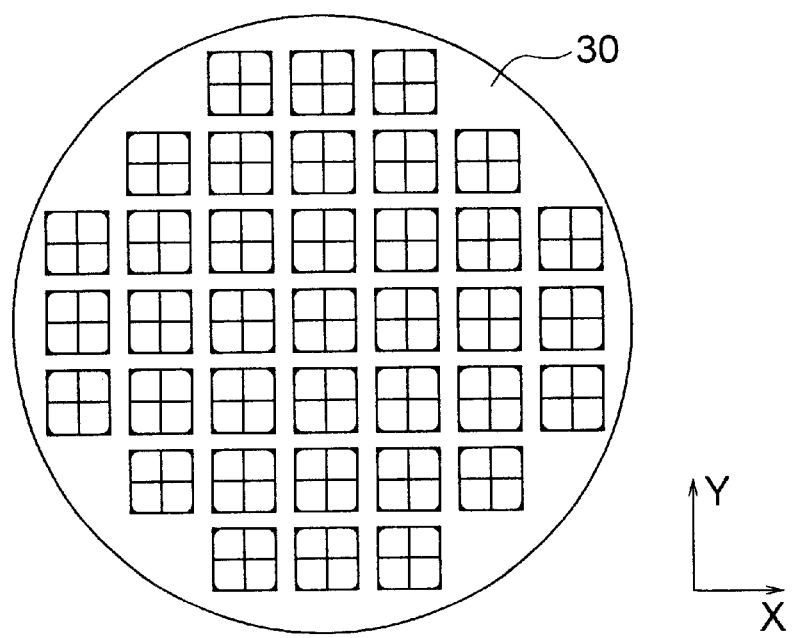

FIGS. 18A, 18B show the configuration of a multichannel gradiometer integrating pickup coils according to a sixth embodiment which has a plurality of gradiometers of the first to fifth embodiments fabricated on the same substrate. FIG. 18A shows an example of 25-channel gradiometer fabricated on a square substrate having one side of 105 mm, and FIG. 18B shows an example of 37-channel gradiometer fabricated on a circular substrate having a radius of 80 mm. The gradiometer for one channel has the same size as those shown in FIGS. 5A, 5B, 16, generally in the shape of a square having one side of 15 mm.

(Seventh Embodiment)

Figure 19:
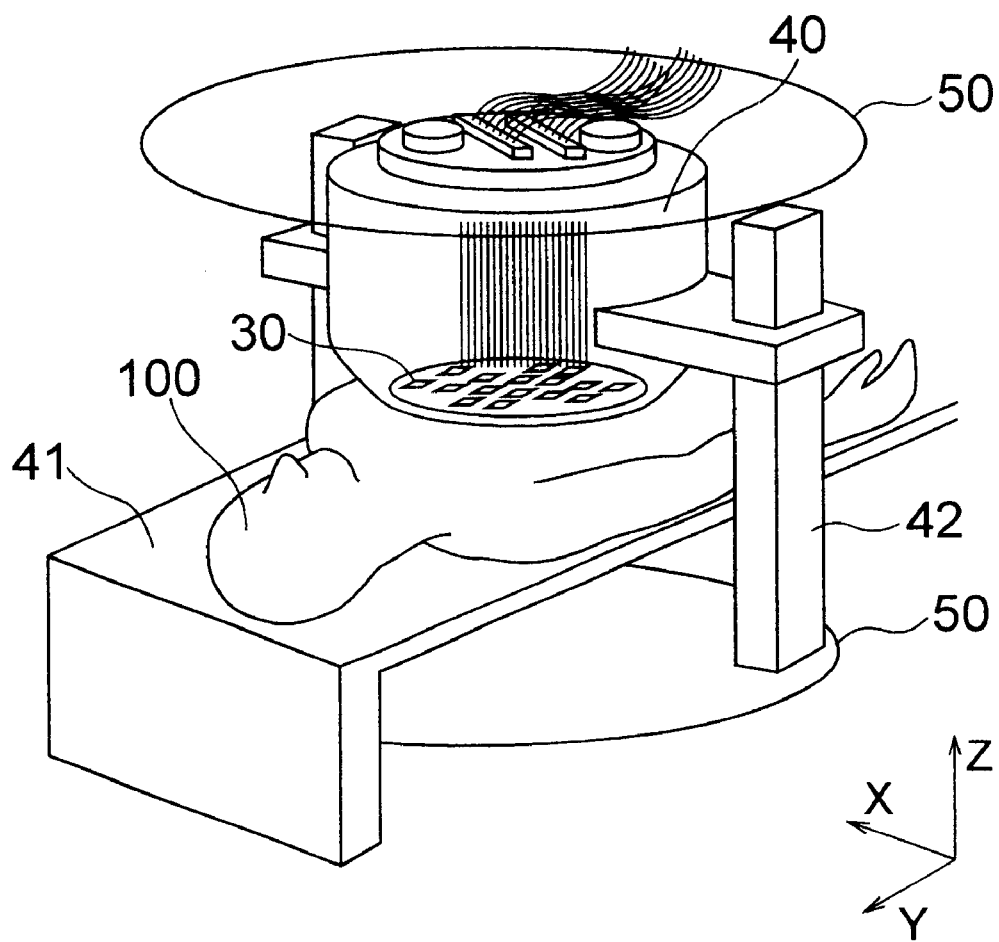
FIG. 19 is a diagram for explaining a main portion of a biomagnetometer according to a seventh embodiment which uses the multichannel gradiometer of the sixth embodiment.

FIG. 19 is a diagram for explaining a main portion of a biomagnetometer according to a seventh embodiment which uses the multichannel gradiometer of the sixth embodiment. A multichannel gradiometer 30 integrating pickup coils is positioned on the bottom of a dewar 40 which is cooled by a coolant such as liquid helium, liquid nitrogen or the like, or by a cryo-cooler. The multichannel gradiometer 30 shown in FIG. 18B is used. Since the gradiometer 30 is positioned on the bottom of the dewar 40, a small amount of liquid nitrogen is sufficient for cooling the gradiometer 30. In addition, a small dewar may be used. The dewar 40 is held by a gantry 42. A subject 100 is carried on a bed 41 such that a site under testing such as the chest or head of the subject is positioned to the bottom of the dewar 40. An active shield is formed using a coil 50 for active shielding in the z-direction using a known technique. Since the gradiometer is extremely thin, the active shield can be simplified in structure.

(Eighth Embodiment)

Figure 20:
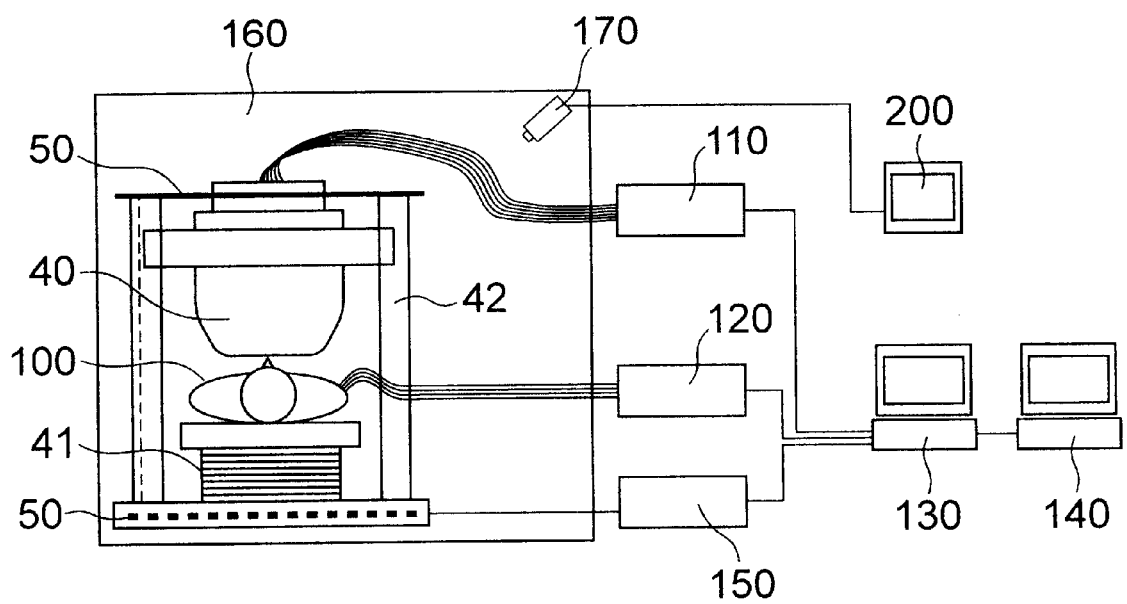
FIG. 20 is a diagram for explaining the general configuration of a biomagnetometer according to an eighth embodiment which uses the multichannel gradiometer of the sixth embodiment.

FIG. 20 is a diagram for explaining the general configuration of a biomagnetometer according to an eighth embodiment which uses the multichannel gradiometer of the sixth embodiment. A dewar 40 having the multichannel gradiometer accommodated within the bottom thereof, and a bed 41 for carrying a subject 100 thereon are placed in a magnetically shielded room 160. A multichannel gradiometer 30 shown in FIG. 18B is used. The output of each channel of the multichannel gradiometer is detected by electronics 110, and sent to a computer 130 for control and data acquisition. As required, an electrocardiograph 120 may be used.

When the active shield is used in combination, a power supply 150 is controlled by the computer 130 for control and data acquisition to supply a current to a coil 50 such that an appropriate magnetic field is generated. Collected data is analyzed by a computer 140 for analysis. Behaviors within the magnetically shielded room 160 may be monitored by a monitor camera 170, the output of which is displayed on the screen of a monitor 200 external to the magnetically shielded room 160.

Since the gradiometer integrating pickup coils of the present invention can reduce introduced environmental magnetic field noise, it can eliminate the need for a notch filter, so far required in the prior art, reduce distortions in detected magnetic field waveforms, and therefore detect correct biomagnetic signals. Also, when the active shielding is applied, the coil for active shielding may only need to be oriented in the z-axis direction, so that the coil for the active shield can be simple in structure.

Further, the gradiometer integrating pickup coils of the present invention is thin and therefore can be cooled in a small-sized cryostat with a small amount of coolant, so that its maintenance is facilitated. In addition, the gradiometer can be extremely readily cooled by a cryo-cooler.

The gradiometer integrating pickup coils of the present invention configured to simultaneously detect ($\Delta Bz/\Delta x$) and ($\Delta Bz/\Delta y$) is designed to place the axial segment of the pickup coils in the x-direction in alignment with the axial segment of the differential SQUID in the x-direction, place the axial segment of the pickup coils in the y-direction in alignment with the axial segment of the differential SQUID in the y-direction, and cross the axial segment of the pickup coils in the x-direction and the axial segment of the pickup coils in the y-direction at right angles. Also, the axial segment of the differential SQUID in the x-direction and the axial segment of the differential SQUID in the y-direction are crossed at right angles. Further, the gradiometer integrating pickup coils is designed to match the center of the pickup coils in the x-direction, the center of the differential SQUID in the x-direction, the center of pickup coils in the y-direction, and the center of the differential SQUID in the y-direction.

Therefore, the present invention can realize a gradiometer integrating pickup coils which can detect a signal indicative of a correct field gradient of a magnetic field in the x-and/or y-direction at the center of the gradiometer, reduce environmental magnetic field noise in a high reduction ratio, and detect a signal for correct magnetic field mapping. This gradiometer integrating pickup coils can be suitable for use in a biomagnetometer and a magnetic field measurement system for conducting a non-destructive evaluation.

The gradiometer integrating pickup coils of the present invention configured to separately detect ($\Delta Bz/\Delta x$) or ($\Delta Bz/\Delta y$) is designed to place the axial segment of the pickup coils in the x-direction in alignment with the axial segment of the differential SQUID in the x-direction or place the axial segment of the pickup coils in the y-direction in alignment with the axial segment of the differential SQUID in the y-direction. In addition, the gradiometer integrating pickup coils is designed to match the center of the pickup coils in the x-direction with the center of the differential SQUID in the x-direction, or match the center of the pickup coils in the y-direction with the center of the differential SQUID in the y-direction. Therefore, the present invention can realize a gradiometer for use in a biomagnetometer or a magnetic field measurement system for conducting a non-destructive evaluation, which can detect a signal indicative of a correct field gradient of a magnetic field in the x-direction or in the y-direction at the center of the gradiometer, reduce environmental magnetic field noise in a high reduction ratio, and extract data for correct magnetic field mapping.

Ideal gradiometers integrating pickup coils of the present invention are configured as follows: (1) For separately detecting ($\Delta Bz/\Delta x$) or ($\Delta Bz/\Delta y$), the axial segment of the pickup coils in the x-direction is completely in alignment with the axial segment of the differential SQUID in the x-direction, or the axial segment of the pickup coils in the y-direction is completely in alignment with the axial segment of the differential SQUID in the y-direction. In addition, the center of the pickup coils in the x-direction completely matches the center of the differential SQUID in the x-direction, or the center of the pickup coils in the y-direction completely matches the center of the differential SQUID in the y-direction. (2) For simultaneously detecting ($\Delta Bz/\Delta x$) and ($\Delta Bz/\Delta y$), the axial segment of the pickup coils in the x-direction is completely in alignment with the axial segment of the differential SQUID in the x-direction, and the axial segment of the pickup coils in the y-direction is completely in alignment with the axial segment of the differential SQUID in the y-direction. Also, the gradiometer is designed to completely match the center of the pickup coils in the x-direction, the center of the differential SQUID in the x-direction, the center of the pickup coils in the y-direction, the center of the differential SQUID in the y-direction. Further, the gradiometer is designed to cross the axial segment of the pickup coils in the x-direction and the axial segment of the pickup coils in the y-direction completely at right angles, and to cross the axial segment of the differential SQUID in the x-direction and the axial segment of the differential SQUID in the y-direction completely at right angles.

In the following, description will be made on tolerances of a deviation of the axial segment of the pickup coils in the x-direction and/or y-direction from complete alignment with the axial segment of the differential SQUID (first deviation); a deviation of the angle formed by the axial segments of the pickup coils in the x-direction and y-direction from the complete right angle (second deviation); a deviation of the angle formed by the differential SQUIDs in the x-direction and y-direction from the complete right angle (third deviation); a deviation of the center of the pickup coils in the x-direction from complete matching with the center of the differential SQUID in the x-direction and/or a deviation of the center of the pickup coils in the y-direction from complete matching with the center of the differential SQUID in the y-direction (fourth deviation); and a deviation of the center of the pickup coils in the x-direction from complete matching with the center of the pickup coils in the y-direction (fifth deviation).

For example, assuming that the axial segment of the detection coil is not in alignment the axial segment of the differential SQUID in the x-direction (or the y-direction), with the first deviation being approximately ±22°, a signal (S) detected by the x-direction (or y-direction) pickup coils only includes approximately 93% of ($\Delta Bz/\Delta x$) (or ($\Delta Bz/\Delta y$)) due to the existence of the first deviation. On the other hand, this corresponds to an increase in S/N by approximately 8%, as compared with an ideal configuration, since noise (N) does not vary. An error in an estimated position of a magnetic field source resulting from this increase in S/N by approximately 8% is approximately 2.4 mm, which is small as compared with an error in an estimated position of a magnetic field source without deviation (approximately 5 mm in general). Thus, the error due to the first deviation will not give rise to any problem in practice. The first deviation is tolerated as long as it is within approximately ±22°.

The axial segment of the pickup coils in the x-direction need not and the axial segment of the pickup coils in the y-direction need not cross completely at right angles. Signals detected by the pickup coils in the x-direction and y-direction respectively include a reduction in signals ($\Delta Bz/\Delta x$) and ($\Delta Bz/\Delta y$) and an increase in noise due to the existence of the second deviation. It has been found from an analysis on an error in an estimated position of a magnetic field source increased by the noise caused by the second deviation that no problem will arise in practice provided that the angle formed by the axial segment of the pickup coils in the x-direction with the axial segment of the pickup coils in the y-direction is in a range of 90 °±22°. The second deviation is tolerated as long as it is within approximately ±22°.

Assume for example that the axial segment of the pickup coils in the x-direction is completely in alignment with the x-axis, the axial segment of the pickup coils in the y-direction forms an angle of approximately ±22° with the y-axis, and the second deviation is approximately ±22°. A signal detected by the pickup coils in the x-direction is not affected by the second deviation, includes approximately 100% of ($\Delta Bz/\Delta x$), and is immune to the noise. A signal (S) detected by the pickup coils in the y-direction on the other hand includes only approximately 93% of ($\Delta Bz/\Delta y$) due to the second deviation. On the other hand, since the noise (N) does not vary, this corresponds to an increase in S/N by approximately 8% as compared with the ideal configuration. Since the increase in S/N by 8% does not increase an error in estimated position of a magnetic field source, this will not give rise to any problem in practice.

Further, the angle formed by the axial segments of the differential SQUIDs in the x-direction and y-direction need not either completely cross at right angles. Similar to the analysis on the second deviation, it has been found from an analysis on an error in estimated position of a magnetic field source increased by noise caused by the third deviation that no problem will arise in practice provided that the angle formed by the axial segment of the differential SQUID in the x-direction with the axial segment of the differential SQUID in the y-direction is in a range of 90 °±22°. The third deviation is tolerated in practice as long as it is within ±22°.

Likewise, it has been found from an analysis on an error in estimated position of a magnetic field source increased by noise caused by the fourth deviation that a deviation of the center of the differential SQUID from the center of the pickup coils can be tolerated provided that it is within approximately 8% of the outer dimension of each differential SQUID formed in the x-direction and/or y-direction. In other words, the fourth deviation can be tolerated in practice as long as it is within approximately 8% of the outer dimension of each differential SQUID formed in the x-direction and/or y-direction.

For example, with each differential SQUID in the shape of a square having one side of 500 μm, the center of the differential SQUID may be deviated from the center of the associated pickup coils by ±40 μm in the x-direction and/or y-direction (i.e., approximately ±60 μm in a direction at an angle of 45° to the x-axis and/or y-axis).

It has been found from an analysis on an error in estimated position of a magnetic field source increased by noise caused by the fifth deviation that a deviation of the center of the pickup coils in the x-direction from the center of the pickup coils in the y-direction can be tolerated provided that the centers are in alignment with each other with a deviation of approximately 8% or less of the outer dimension of each pickup coils. In other words, the fifth deviation can be tolerated in practice as long as it is within approximately 8% of the outer dimension of each differential pickup coil formed in the x-direction and/or y-direction.

For example, with each pickup coil in the shape of a square having one side of 7.5 mm, the center of the pickup coils in the x-direction may be deviated from the center of the pickup coils in the y-direction by ±600 μm in the x-direction and y-direction (i.e., approximately ±850 μm in directions at an angle of 45° to the x-axis and y-axis).

As long as each of the first to fifth deviations is within the tolerable range mentioned above, a signal indicative of a field gradient in a magnetic field can be accurately measured in the x-direction and/or y-direction at the center of the gradiometer integrating pickup coils with environmental magnetic field noise reduced at a high reduction ratio, so that signals can be detected for correct magnetic field mapping without increasing an error in estimated position of a magnetic field source.

What is claimed is:

1. A gradiometer integrated with pickup coils comprising:
    a first and a second pickup coils fabricated of a thin film on a substrate; and
    a differential SQUID fabricated of a thin film on said substrate and magnetically coupled to said first and second pickup coils, said differential SQUID including a first and a second superconducting loops connected in series or in parallel,
    wherein a first segment resulting from projecting a segment connecting the center of said first pickup coil with the center of said second pickup coil perpendicularly onto the surface of said substrate overlaps a second segment resulting from projecting a segment connecting the center of said first superconducting loop with the center of said second superconducting loop perpendicularly onto the surface of said substrate,
    wherein a midpoint of said first segment matches a midpoint of said second segment, and
    wherein said gradiometer integrated with pickup coils detects a field gradient in a z-direction with respect to an x-direction or a y-direction parallel with the surface of said substrate and perpendicular to the z-direction perpendicular to the surface of said substrate.

2. A gradiometer integrated with pickup coils according to claim 1,
    wherein said first pickup coil having a closed loop formed by a first loop, and said second pickup coil having a closed loop formed by a second loop.

3. A gradiometer integrated with pickup coils according to claim 2,
    wherein said first pickup coil has a first input coil in said first loop for inputting magnetic flux generated by a first current induced in said first pickup coil by a magnetic field in a z-direction perpendicular to the surface of said substrate into said first superconducting loop,
    wherein said second pickup coil has a second input coil in said second loop for inputting magnetic flux generated by a second current induced in said second pickup coil by the magnetic field in the z-direction into said second superconducting loop.

4. A gradiometer integrated with pickup coils comprising:
    a first, a second, a third and a fourth pickup coils fabricated of a thin film on a substrate;
    a first differential SQUID fabricated of a thin film on said substrate and magnetically coupled to said first and second pickup coils, said first differential SQUID including a first and a second superconducting loop connected in series or in parallel; and
    a second differential SQUID fabricated of a thin film on said substrate and magnetically coupled to said third and fourth pickup coils, said second differential SQUID including a third and a forth superconducting loop connected in series or in parallel,
    wherein a first segment resulting from projecting a segment connecting the center of said first pickup coil with the center of said second pickup coil perpendicularly onto the surface of said substrate overlaps a second segment resulting from projecting a segment connecting the center of said first superconducting loop with the center of said second superconducting loop perpendicularly onto the surface of said substrate,
    wherein a third segment resulting from projecting a segment connecting the center of said third pickup coil with the center of said fourth pickup coil perpendicularly onto the surface of said substrate overlaps a fourth segment resulting from projecting a segment connecting the center of said third superconducting loop with the center of said fourth superconducting loop perpendicularly onto the surface of said substrate,
    wherein said first segment and said third segment cross at light angles,
    wherein a midpoint of said first segment, a midpoint of said second segment, a midpoint of said third segment, and a midpoint of said fourth segment match one another, and
    wherein said gradiometer integrated with pickup coils detects a field gradient in a z-direction with respect to an x-direction and a y-direction parallel with the surface of said substrate and perpendicular to the z-direction perpendicular to the surface of said substrate.

5. A gradiometer integrated with pickup coils according to claim 4,
    wherein said first pickup coil having a closed loop formed by a first loop, said second pickup coil having a closed loop formed by a second loop, said third pickup coil having a closed loop formed by a third loop, and said fourth pickup coil having a closed loop formed by a fourth loop.

6. A gradiometer integrated with pickup coils according to claim 5,
  wherein said first pickup coil has a first input coil in said first loop for inputting magnetic flux generated by a first current induced in said first pickup coil by a magnetic field in a z-direction perpendicular to the surface of said substrate into said first superconducting loop,
  wherein said second pickup coil has a second input coil in said second loop for inputting magnetic flux generated by a second current induced in said second pickup coil by the magnetic field in the z-direction into said second superconducting loop,
  wherein said third pickup coil has a third input coil in said third loop for inputting magnetic flux generated by a third current induced in said third pickup coil by the magnetic field in the z-direction into said third superconducting loop, and
  wherein said fourth pickup coil has a fourth input coil in said fourth loop for inputting magnetic flux generated by a fourth current induced in said fourth pickup coil by the magnetic field in the z-direction into said fourth superconducting loop.

7. A gradiometer integrated with pickup coils comprising:
  a first pickup coil fabricated of a thin film on a substrate, said first pickup coil having a first and a second pickup loop connected to have an 8-figured shape as a whole such that currents flow through said first and second pickup loops in directions opposite to each other;
  a second pickup coil fabricated of a thin film on said substrate, said second pickup coil having a third and a fourth pickup loop connected to have an 8-figured shape as a whole such that currents flow through said third and fourth pickup loops in directions opposite to each other;
  a first differential SQUID fabricated of a thin film on said substrate and magnetically coupled to said first and second pickup coils, said first differential SQUID including a first and a second superconducting loop connected in series or in parallel; and
  a second differential SQUID fabricated of a thin film on said substrate and magnetically coupled to said third and fourth pickup coils, said second differential SQUID including a third and a forth superconducting loop connected in series or in parallel,
  wherein a first segment resulting from projecting a segment connecting the center of said first pickup loop with the center of said second pickup loop perpendicularly the surface of said substrate overlaps a second segment resulting from projecting a segment connecting the center of said first superconducting loop with the center of said second superconducting loop perpendicularly onto the surface of said substrate,
  wherein a third segment resulting from projecting a segment connecting the center of said third pickup loop with the center of said fourth pickup loop perpendicularly onto the surface of said substrate overlaps a fourth segment resulting from projecting a segment connecting the center of said third superconducting loop with the center of said fourth superconducting loop perpendicularly onto the surface of said substrate,
  wherein said first segment and said third segment cross at light angles,
  wherein a midpoint of said first segment, a midpoint of said second segment, a midpoint of said third segment, and a midpoint of said fourth segment match one another, and
  wherein said gradiometer integrated with pickup coils detects a field gradient in a z-direction with respect to an x-direction and a y-direction parallel with the surface of said substrate and perpendicular to the z-direction perpendicular to the surface of said substrate.

8. A gradiometer integrated with pickup coils comprising:
  a pickup coil fabricated of a thin film on a substrate, said pickup coil having a first and a second pickup loop connected to have an 8-figured shape as a whole such that currents flow through said first and second pickup loops in directions opposite to each other; and
  a differential SQUID fabricated of a thin film on said substrate and magnetically coupled to said first and second pickup coils, said differential SQUID including a first and
  a second superconducting loop connected in series or in parallel,
  wherein a first segment resulting from projecting a segment connecting the center of said first pickup loop with the center of said second pickup loop perpendicularly onto the surface of said substrate overlaps a second segment resulting from projecting a segment connecting the center of said first superconducting loop with the center of said second superconducting loop perpendicularly onto the surface of said substrate,
  wherein a midpoint of said first segment and a midpoint of said second segment match one another, and wherein said gradiometer integrated with pickup coils detects a field gradient in a z-direction with respect to an x-direction or a y-direction parallel with the surface of said substrate and perpendicular to the z-direction perpendicular to the surface of said substrate.

9. A gradiometer integrated with pickup coils comprising:
  a first and a second pickup coils each formed by a superconducting loop connected in series or in parallel; and
  a differential SQUID fabricated of a thin film on a substrate, said differential SQUID having a plurality of superconducting loops connected with each other and connected in parallel with said first and second pickup coils, respectively,
  wherein said first pickup coil and said second pickup coil are in parallel with the surface of said substrate, and symmetric about an x-axis or a y-axis perpendicular to a z-axis perpendicular to the surface of said substrate, and wherein said gradiometer integrated with pickup coils detects a field gradient in the z-direction with respect to the x-direction or the y-direction.

10. A gradiometer integrated with pickup coils comprising:
  a first and a second pickup coils each formed by a superconducting loop connected in series or in parallel;
  a first differential SQUID fabricated of a thin film on a substrate, said first differential SQUID having a plurality of superconducting loops connected with each other and connected in parallel with said first and second pickup coils, respectively;
  a third and a fourth pickup coils each formed by a superconducting loop connected in series or in parallel; and
  a second differential SQUID fabricated of a thin film on said substrate, said second differential SQUID having a plurality of superconducting loops connected with each other and connected in parallel with said third and fourth pickup coils, respectively, wherein a first segment resulting from projecting a segment connecting the center of said first pickup coil with the center of said second pickup coil perpendicularly onto the surface of said substrate and a segment connecting the center of said third pickup and the center of said fourth pickup coil perpendicularly onto the surface of said substrate cross at right angles, wherein a midpoint of said first segment matches a midpoint of said second segment, and wherein said gradiometer integrated with pickup coils detects a field gradient in a z-direction with respect to an x-direction and a y-direction parallel with the surface of said substrate and perpendicular to the z-direction perpendicular to the surface of said substrate.

11. A magnetic field measurement system including a gradiometer integrated with pickup coils comprising:

a first and a second pickup coils fabricated of a thin film on a substrate; and a differential SQUID fabricated of a thin film on said substrate and magnetically coupled to said first and second pickup coils, said differential SQUID including a first and a second superconducting loops connected in series or in parallel, wherein a first segment resulting from projecting a segment connecting the center of said first pickup coil with the center of said second pickup coil perpendicularly onto the surface of said substrate overlaps a second segment resulting from projecting a segment connecting the center of said first superconducting loop with the center of said second superconducting loop perpendicularly onto the surface of said substrate, wherein a midpoint of said first segment matches a midpoint of said second segment, and wherein said gradiometer integrated with pickup coils detects a field gradient in a z-direction with respect to an x-direction or a y-direction parallel with the surface of said substrate and perpendicular to the z-direction perpendicular to the surface of said substrate.

12. A magnetic field measurement system including a gradiometer integrated with pickup coils comprising:

a first, a second, a third and a fourth pickup coils fabricated of a thin film on a substrate;

a first differential SQUID fabricated of a thin film on said substrate and magnetically coupled to said first and second pickup coils, said first differential SQUID including a first and a second superconducting loop connected in series or in parallel; and a second differential SQUID fabricated of a thin film on said substrate and magnetically coupled to said third and fourth pickup coils, said second differential SQUID including a third and a forth superconducting loop connected in series or in parallel, wherein a first segment resulting from projecting a segment connecting the center of said first pickup coil with the center of said second pickup coil perpendicularly onto the surface of said substrate overlaps a second segment resulting from projecting a segment connecting the center of said first superconducting loop with the center of said second superconducting loop perpendicularly onto the surface of said substrate, wherein a third segment resulting from projecting a segment connecting the center of said third pickup coil with the center of said fourth pickup coil perpendicularly onto the surface of said substrate overlaps a fourth segment resulting from projecting a segment connecting the center of said third superconducting loop with the center of said fourth superconducting loop perpendicularly onto the surface of said substrate, wherein said first segment and said third segment cross at light angles, wherein a midpoint of said first segment, a midpoint of said second segment, a midpoint of said third segment, and a midpoint of said fourth segment match one another, and wherein said gradiometer integrated with pickup coils detects a field gradient in a z-direction with respect to an x-direction and a y-direction parallel with the surface of said substrate and perpendicular to the z-direction perpendicular to the surface of said substrate.

13. A magnetic field measurement system including a gradiometer integrated with pickup coils comprising:

a first pickup coil fabricated of a thin film on a substrate, said first pickup coil having a first and a second pickup loop connected to have an 8-figured shape as a whole such that currents flow through said first and second pickup loops in directions opposite to each other;

a second pickup coil fabricated of a thin film on said substrate, said second pickup coil having a third and a fourth pickup loop connected to have an 8-figured shape as a whole such that currents flow through said third and fourth pickup loops in directions opposite to each other;

a first differential SQUID fabricated of a thin film on said substrate and magnetically coupled to said first and second pickup coils, said first differential SQUID including a first and a second superconducting loop connected in series or in parallel; and a second differential SQUID fabricated of a thin film on said substrate and magnetically coupled to said third and fourth pickup coils, said second differential SQUID including a third and a forth superconducting loop connected in series or in parallel, wherein a first segment resulting from projecting a segment connecting the center of said first pickup loop with the center of said second pickup loop perpendicularly the surface of said substrate overlaps a second segment resulting from projecting a segment connecting the center of said first superconducting loop with the center of said second superconducting loop perpendicularly onto the surface of said substrate, wherein a third segment resulting from projecting a segment connecting the center of said third pickup loop with the center of said fourth pickup loop perpendicularly onto the surface of said substrate overlaps a fourth segment resulting from projecting a segment connecting the center of said third superconducting loop with the center of said fourth superconducting loop perpendicularly onto the surface of said substrate, wherein said first segment and said third segment cross at light angles, wherein a midpoint of said first segment, a midpoint of said second segment, a midpoint of said third segment, and a midpoint of said fourth segment match one another, and wherein said gradiometer integrated with pickup coils detects a field gradient in a z-direction with respect to an x-direction and a y-direction parallel with the surface of said substrate and perpendicular to the z-direction perpendicular to the surface of said substrate.

14. A magnetic field measurement system including a gradiometer integrated with pickup coils comprising:
- a pickup coil fabricated of a thin film on a substrate, said pickup coil having a first and a second pickup loop connected to have an 8-figured shape as a whole such that currents flow through said first and second pickup loops in directions opposite to each other; and
- a differential SQUID fabricated of a thin film on said substrate and magnetically coupled to said first and second pickup coils, said differential SQUID including a first and
- a second superconducting loop connected in series or in parallel,
- wherein a first segment resulting from projecting a segment connecting the center of said first pickup loop with the center of said second pickup loop perpendicularly onto the surface of said substrate overlaps a second segment resulting from projecting a segment connecting the center of said first superconducting loop with the center of said second superconducting loop perpendicularly onto the surface of said substrate,
- wherein a midpoint of said first segment and a midpoint of said second segment match one another, and wherein said gradiometer integrated with pickup coils detects a field gradient in a z-direction with respect to an x-direction or a y-direction parallel with the surface of said substrate and perpendicular to the z-direction perpendicular to the surface of said substrate.

15. A magnetic field measurement system including a gradiometer integrated with pickup coils comprising:
- a first and a second pickup coils each formed by a superconducting loop connected in series or in parallel; and
- a differential SQUID fabricated of a thin film on a substrate, said differential SQUID having a plurality of superconducting loops connected with each other and connected in parallel with said first and second pickup coils, respectively,
- wherein said first pickup coil and said second pickup coil are in parallel with the surface of said substrate, and symmetric about an x-axis or a y-axis perpendicular to a z-axis perpendicular to the surface of said substrate, and wherein said gradiometer integrated with pickup coils detects a field gradient in the z-direction with respect to the x-direction or the y-direction.

16. A magnetic field measurement system including a gradiometer integrated with pickup coils comprising:
- a first and a second pickup coils each formed by a superconducting loop connected in series or in parallel;
- a first differential SQUID fabricated of a thin film on a substrate, said first differential SQUID having a plurality of superconducting loops connected with each other and connected in parallel with said first and second pickup coils, respectively;
- a third and a fourth pickup coils each formed by a superconducting loop connected in series or in parallel; and
- a second differential SQUID fabricated of a thin film on said substrate, said second differential SQUID having a plurality of superconducting loops connected with each other and connected in parallel with said third and fourth pickup coils, respectively,
- wherein a first segment resulting from projecting a segment connecting the center of said first pickup coil with the center of said second pickup coil perpendicularly onto the surface of said substrate and a segment connecting the center of said third pickup and the center of said fourth pickup coil perpendicularly onto the surface of said substrate cross at right angles,
- wherein a midpoint of said first segment matches a midpoint of said second segment, and
- wherein said gradiometer integrated with pickup coils detects a field gradient in a z-direction with respect to an x-direction and a y-direction parallel with the surface of said substrate and perpendicular to the z-direction perpendicular to the surface of said substrate.

* * * * *